United States Patent [19]

Tamaki et al.

[11] Patent Number: 5,780,898
[45] Date of Patent: *Jul. 14, 1998

[54] SEMICONDUCTOR DEVICE WITH A VERTICAL FIELD EFFECT TRANSISTOR AND METHOD OF MANUFACTURING THE SAME

[75] Inventors: Tokuhiko Tamaki; Tatsuo Sugiyama; Hiroaki Nakaoka, all of Osaka, Japan

[73] Assignee: Matsushita Electric Industrial Co. Ltd., Osaka, Japan

[*] Notice: The term of this patent shall not extend beyond the expiration date of Pat. No. 5,670,810.

[21] Appl. No.: 856,697

[22] Filed: May 15, 1997

Related U.S. Application Data

[63] Continuation of Ser. No. 518,973, Aug. 24, 1995, Pat. No. 5,670,810.

[30] Foreign Application Priority Data

Aug. 25, 1994 [JP] Japan .................................. 6-200656
Jun. 8, 1995 [JP] Japan .................................. 7-142005

[51] Int. Cl.$^6$ .......................... H01L 29/76; H01L 29/74; H01L 31/062
[52] U.S. Cl. ................... 257/331; 257/333; 257/334
[58] Field of Search ........................ 257/330, 331, 257/332, 333, 334

[56] References Cited

U.S. PATENT DOCUMENTS 5,670,810  9/1997  Tamaki et al. ................. 257/331

Primary Examiner—Ngân V. Ngô
Attorney, Agent, or Firm—McDermott, Will & Emery

[57] ABSTRACT

On a semiconductor substrate made of p-type silicon, there are formed, in a successively layered fashion, a first p-type silicon semiconductor layer, laterally paired first n-type silicon semiconductor layers, laterally paired second p-type silicon semiconductor layers, and laterally paired n-type silicon semiconductor layers, by an epitaxial growth method. On the second n-type silicon semiconductor layer on the right side, there are successively formed a third p-type silicon semiconductor layer, a third n-type silicon semiconductor layer and a fourth p-type silicon semiconductor layer. The left first n-type silicon semiconductor layer, left second p-type silicon semiconductor layer and left second n-type silicon semiconductor layer form a first insular multilayered portion forming an n-channel MOSFET. The third p-type silicon semiconductor layer, third n-type silicon semiconductor layer and fourth p-type silicon semiconductor layer form a second insular portion forming a p-channel MOSFET. A first gate electrode is formed on a side surface of the left second p-type silicon semiconductor layer with a gate insulating film therebetween, and a second gate electrode is formed on a side surface of the right third n-type silicon semiconductor layer with a gate insulating film therebetween.

1 Claim, 21 Drawing Sheets

SEMICONDUCTOR DEVICE WITH A VERTICAL FIELD EFFECT TRANSISTOR AND METHOD OF MANUFACTURING THE SAME

This is a continuation of application Ser. No. 08/518.973, filed Aug. 24, 1995, now U.S. Pat. No. 5,670,810.

BACKGROUND OF THE INVENTION

The present invention relates to a semiconductor device using a vertical field-effect transistor (FET) in which a current flows in a vertical direction with respect to a substrate, and also relates to a method of manufacturing the same.

DESCRIPTION OF THE BACKGROUND ART

Higher packing density of semiconductor devices requires smaller critical dimension (CD). However, it is difficult to reduce deviation in CD at lithography process, and nonnegligible dispersion of MOSFET characteristics may occur due to the deviation in CD, which becomes a primary factor impeding s- ng trend.

In view of the fact that the above problem is now significant, a vertical field-effect transistor has attracted the attention because its channel length can be precisely controlled not by a lithography technique but depending a layer thickness.

In many cases (which will be referred as a first prior art), an epitaxial growth method is used to produce the vertical fieldeffect transistor as disclosed in, e.g., Japanese Laid-Open Patent publication Nos. 63-229756 (1988), 2-66969 (1990) and 3-60075 (1991).

As a method using the epitaxial growth method, such a method has been proposed for preventing punch-through that a δ-doped layer is provided at a center of a channel layer which is formed by an MBE (Molecular Beam Epitaxy) method ("Vertical Si-MOSFETs with Channel Lengths Down to 45 nm" 'H. Gossner et al., Extended Abstracts of the 1993 International Conference on Solid State Devices and Materials, pp. 422–424).

As shown at (a)–(h) in FIG. 4 of U.S. Pat. Specification No. 5,016,067, there have been proposed a vertical field-effect transistor (which will be referred to as a second prior art), in which source, channel and drain layers are formed by ion implantation and thermal diffusion, as well as a field-effect transistor (which will be referred to as a third prior art) in which an impurity diffusion layer is formed by ion implantation as disclosed in "Impact on Surrounding Gate Transistor (SGT) for Ultra-High-Density LSI's" (H. Takato et al., IEEE Trans. Electron Devices, ED-38, p. 573 (1991)).

However, in the first prior art in which the vertical field-effect transistor is formed by the epitaxial growth method, a film of a common polarity is formed entirely over a semiconductor substrate, so that it is difficult to form an n-type field-effect transistor and a p-type field-effect transistor on the same semiconductor substrate, which results in difficulty in formation of a CMOS circuit.

In view of miniaturization of electronic equipments, it is essential to reduce a power consumption of transistor circuits, and for this purpose, it is desired to form transistor circuits having a CMOS structure.

If the vertical field-effect transistor is produced by the selective epitaxial growth method as disclosed in the Japanese Laid-Open Patent publication No. 2-66969, the CMOS circuit can be formed, but a channel length cannot be precisely controlled to a designed value due to increase in number of manufacturing steps and increase of thermal hysteresis caused by increase in number of times of epitaxial growth. Therefore, the vertical field-effect transistor having a short channel length cannot be produced.

According to the second and third prior arts in which the vertical field-effect transistor is produced by ion implantation, the CMOS circuit can be produced relatively easily.

According to the method in the second prior art disclosed, e.g., in the U.S. Pat. Specification No. 5,016,067, however, the channel length of the transistors forming the CMOS circuit cannot be controlled precisely. The reason for this is as follows. In the case where heat treatment is carried out after implantation of ions into the channel layer or heat treatment is carried out after implantation of ions into an uppermost layer, i.e., a source or drain layer, if thermal diffusion is insufficient, a uniform concentration is not obtained in the channel layer, which results in difficulty in control of the channel length. Meanwhile, if the thermal diffusion is carried out excessively, impurity of the opposite conductivity type diffuses into the channel layer from its upper and lower sides, so that the channel length is unexpectedly reduced.

According to the third prior art, a lower impurity diffusion region, which is formed on a semiconductor substrate by ion implantation for forming a drain or a source, surrounds the channel layer, and hence it has a large area. Therefore, the occupied area of the vertical field-effect transistor cannot be reduced sufficiently, and a coupling capacitance at the lower side excessively increases, resulting in reduction of the operation speed.

SUMMARY OF THE INVENTION

In view of the foregoing, it is a first object of the invention to allow precise control of a channel length of semiconductor devices by using vertical field effect transistor formed on a semiconductor substrate and reduction of a coupling capacitance thereof. It is a second object of the invention to allow easy and reliably production of a complementary semiconductor device such as a vertical CMOSFET and a vertical CMOS inverter.

A first semiconductor device according to the invention comprises a semiconductor substrate; an insular multilayered portion formed on the semiconductor substrate and including, in a successively layered fashion, a first semiconductor layer doped with impurity of a first conductivity type and forming a source or a drain, a second semiconductor layer doped with impurity of a second conductivity type and forming a channel, and a third semiconductor layer doped with impurity of the first conductivity type and forming the drain or the source; and a gate electrode formed on a side surface of the second semiconductor layer with a gate insulating film therebetween.

According to the first semiconductor device, since the channel length depends on a film thickness of the second semiconductor layer forming the channel layer, the channel length can be controlled precisely. The insular multilayered portion formed on the semiconductor substrate is provided with the first semiconductor layer forming the source or drain, the second semiconductor layer forming the channel and the third semiconductor layer forming the source or drain, and thus the first semiconductor layer forming the source or drain is formed immediately under the second semiconductor layer forming the channel layer. Therefore, an area of the first semiconductor layer, and hence an area of the semiconductor device can be small, so that the coupling capacitance can be small, which allows high speed operation. Also, the semiconductor device can be miniaturized to a higher extent.

In the first semiconductor device, the first semiconductor layer may preferably comprise a projection projected beyond the second semiconductor layer in a surface direction of the substrate. In this structure, the projection can be used as a lead electrode of the source or drain.

It is preferable that the thickness of the projection is smaller than the thickness of the third semiconductor layer. This structure offers the following advantage in such processing that a conductive layer entirely covering the insular multilayered portion is formed and then is anisotropically etched to form the gate electrode. Since the thickness of the projection is smaller than the thickness of the third semiconductor layer, overetching can be effected to remove fully the conductive layer from the side surface of the projection while maintaining such a state that the side surface of the channel layer is completely covered with the gate electrode, because the conductive layer completely covers the side surface of the second semiconductor layer.

In the first semiconductor device, it is preferable that the gate insulating film is formed of an insulating film entirely covering the insular multilayered portion, and a thickness of a portion of the insulating film located at the sides of the first and third semiconductor layers is larger than a thickness of the gate electrode film. This can reduce a parasitic capacity of the gate electrode owing to the small thickness of the gate insulating film, and can prevent electrostatic destruction owing to the large film thickness of the insulating film other than the gate insulating film.

In the first semiconductor device, the first and third semiconductor layers may preferably be provided at regions in contact with the second semiconductor layer with lightly doped semiconductor layers lightly doped with impurity of the first conductivity type, respectively. This suppresses concentration of an electric field at a region in the channel layer near the drain layer, so that electrical characteristics of the semiconductor device such as an MOSFET are improved.

In the first semiconductor device, the second semiconductor layer may preferably contain the impurity of the second conductivity type distributed to form a plurality of concentration peaks.

This enables a uniform concentration of impurity in the second semiconductor layer forming the channel, even if thermal diffusion is not sufficient. Therefore, it is possible to prevent nonuniformity in concentration of impurity in the channel layer which may be caused by insufficient thermal diffusion. Therefore, characteristics of the semiconductor device such as a transistor can be stable, and it is possible to prevent a problem of increase of the channel length which may be caused by diffusion of impurity of the opposite type from the upper and lower sides of the channel layer resulting from excessive thermal diffusion, so that the channel layer can be controlled precisely in accordance with the design.

A second semiconductor device according to the invention comprises a semiconductor substrate; a first insular multilayered portion formed on the semiconductor substrate and including, in a successively layered fashion, a first semiconductor layer doped with impurity of a first conductivity type and forming a source or a drain, a second semiconductor layer doped with impurity of a second conductivity type and forming a channel, and a third semiconductor layer doped with impurity of the first conductivity type and forming the drain or the source; a second insular multilayered portion formed on the semiconductor substrate and including, in a successively layered fashion, a fourth semiconductor layer doped with impurity of the second conductivity type and forming a source or a drain, a fifth semiconductor layer doped with impurity of the first conductivity type and forming a channel, and a sixth semiconductor layer doped with impurity of the second conductivity type and forming the drain or the source; a first gate electrode formed on a side surface of the second semiconductor layer with a first gate insulating film therebetween; and a second gate electrode formed on a side surface of the fifth semiconductor layer with a second gate insulating film therebetween.

According to the second semiconductor device, since the channel length depends on the film thickness of the second or fifth semiconductor layer forming the channel layer, the channel length can be controlled precisely.

The first and fourth semiconductor layers forming the source or drain are formed immediately under the second and fifth semiconductor layers forming the channel layer, respectively. Therefore, an area of the first semiconductor layer, and hence an area of the semiconductor device can be small, so that the coupling capacity can be small, which allows high speed operation. Also, the semiconductor device can be miniaturized to a higher extent. The multilayered portion formed of the first, second and third semiconductor layers as well as the multilayered portion formed of the fourth, fifth and sixth semiconductor layers each are in an insular form, and thus can be formed by etching multilayered portions deposited by epitaxial growth. Therefore, CMOS circuit can be formed at the single semiconductor substrate through simple manufacturing steps.

In the second semiconductor device, the first semiconductor layer may preferably include a first projection projected beyond the second semiconductor layer in a surface direction of the substrate, and the fourth semiconductor layer may preferably include a second projection projected beyond the fifth semiconductor layer in the surface direction of the substrate. In this structure, each of the first and second projections can be used as a lead electrode of the source or drain.

It is preferable that the thickness of the first projection is smaller than the thickness of the third semiconductor layer and the thickness of the second projection is smaller than the thickness of the sixth semiconductor layer. This structure offers the following advantage in such processing that a conductive layer entirely covering the first and second insular multilayered portions is formed and then is anisotropically etched to form the gate electrodes. Since the thicknesses of the first and second projections are smaller than the thicknesses of the third and sixth semiconductor layers, respectively, overetching can be effected to remove fully the conductive layer from the side surfaces of the first and second projections while maintaining such a state that the side surfaces of the channel layer are completely covered with the gate electrodes, because the conductive layer completely covers the side surfaces of the second and fifth semiconductor layers.

In the second semiconductor device having the first and second projections, the first semiconductor layer may be a source of an MOSFET of a first polarity forming a CMOS inverter, the third semiconductor layer may be a drain of the MOSFET of the first polarity, the fourth semiconductor layer may be a source of an MOSFET of a second polarity forming the CMOS inverter, and the sixth semiconductor layer may be a drain of the MOSFET of the second polarity. According to this structure, the third and sixth semiconductor layers of a small parasitic capacitance are used for the drains of the CMOS inverter, so that the operation speed and power consumption of the device can be improved.

In the second semiconductor device, it is preferable that the first gate insulating film is formed of a first insulating film entirely covering the first insular multilayered portion, a thickness of a portion of the first insulating film located at the sides of the first and third semiconductor layers is larger than a thickness of a first gate electrode film, the second gate insulating film is formed of a second insulating film entirely covering the second insular multilayered portion, and a thickness of a portion of the second insulating film located at the sides of the fourth and sixth semiconductor layers is larger than a thickness of a second gate electrode film.

This can reduce parasitic capacities of the first and second gate electrodes owing to the small thicknesses of the first and second gate insulating films, and can prevent electrostatic Destruction owing to the large film thickness of the insulating film other than the first and second gate insulating films.

In the second semiconductor device, the first and third semiconductor layers may preferably be provided at regions in contact with the second semiconductor layer with lightly doped semiconductor layers lightly doped with impurity of the first conductivity type, respectively, and the fourth and sixth semiconductor layers may preferably be provided at regions in contact with the fifth semiconductor layer with lightly doped semiconductor layers lightly doped with impurity of the second conductivity type, respectively. This suppresses concentration of an electric field at a region in each channel layer near the drain layer, so that electrical characteristics of the semiconductor device such as an MOSFET are improved.

In the second semiconductor device, the second insular multilayered portion may be formed on the first insular multilayered portion. This further reduces an area occupied by the semiconductor device such as an FET or an inverter having a CYMOS circuit.

The second semiconductor device may preferably have such a structure that the first insular multilayered portion has an upper area larger than a lower area of the second insular multilayered portion, the first insular multilayered portion forms a p-channel MOSFET, and the second insular multilayered portion forms an n-channel MOSFET. According to this structure, the first insular multilayered portion having a large lower area forms the p-channel MOSFET having a low current drive capacity, so that reduction of the current drive capacity of the CMOSFET is suppressed.

In the second semiconductor device, the fourth semiconductor layer may be disposed at the side of the first semiconductor layer, the fifth semiconductor layer may be disposed at the side of the second semiconductor layer, and the sixth semiconductor layer may be disposed at the side of the third semiconductor layer.

According to this structure, p-channel and n-channel MOSFETs can be disposed substantially at the same level, so that a height of the semiconductor device having a CMOS circuit can be small.

In the case where the first and fourth semiconductor layers, the second and fifth semiconductor layers, and the third and sixth semiconductor layers are disposed side by side, it is preferable that the first and fourth semiconductor layers have an equal height, the second and fifth semiconductor layers have an equal height, and the third and sixth semiconductor layers have an equal height.

According to this structure, the first and second insular multilayered portions can be formed simultaneously, so that the manufacturing steps can be reduced in number.

In the second semiconductor device, at least one of the second and fifth semiconductor layers may preferably contain the impurity distributed to form a plurality of concentration peaks.

This can prevent nonuniform concentration of impurity in the channel layer which may be caused by insufficient thermal diffusion, and it is also possible to prevent a problem of increase of the channel length which may be caused by excessive thermal diffusion. Therefore, characteristics of respective transistors can be stable, and respective channel layers can be controlled precisely in accordance with the design.

A first method of manufacturing a semiconductor device according to the invention comprises a first step of forming a multilayered semiconductor layer formed on a semiconductor substrate and including, in a successively layered fashion, a first semiconductor layer doped with impurity of a first conductivity type and forming a source or a drain, a second semiconductor layer doped with impurity of a second conductivity type and forming a channel, and a third semiconductor layer doped with impurity of the first conductivity type and forming the drain or the source; a second step of etching the first, second and third semiconductor layers forming the multilayered semiconductor layer to form an insular multilayered portion formed of the first, second and third semiconductor layers on the semiconductor substrate; a third step of forming an insulating film covering the insular multilayered portion; and a fourth step of forming a gate electrode on a side surface of the second semiconductor layer with an insulating film therebetween.

According to the first method, since the insular multilayered portion formed of the first, second and third semiconductor layers is formed by etching the multilayered semiconductor layer including, in a successively layered fashion, the first semiconductor layer forming the source or drain, the second semiconductor layer forming the channel and the third semiconductor layer forming the drain or source. Therefore, the channel length can be controlled precisely. Also, an area of the first semiconductor layer, and hence an area of the semiconductor device can be small, so that the coupling capacity can be small. Therefore, the first semiconductor device which allows high speed operation and further miniaturization of the semiconductor device can be surely manufactured.

In the first manufacturing method, the second step may preferably include an insular portion forming step of effecting etching selectively on the second and third semiconductor layers to form an insular portion formed of the second and third semiconductor layers; and a projection forming step of effecting etching selectively on the first semiconductor layer to form a projection formed of the first semiconductor layer and projected beyond the second semiconductor layer of the insular portion in a surface direction of the substrate.

According to this manner in which the insular portion is formed by selectively etching the second and third semiconductor layers, and then the etching is effected selectively on the first semiconductor layer, there is formed the projection which is formed of the first semiconductor layer and projects beyond the second semiconductor layer in the substrate surface direction.

In this case, the projection forming step may preferably include a step of forming the projection having a thickness smaller than a thickness of the third semiconductor layer.

This method offers the following advantage in such processing that a conductive layer entirely covering the insular multilayered portion is formed and then is anisotropically etched to form the gate electrode. Since the thickness of the projection is smaller than the thickness of the third semiconductor layer, overetching can be effected to remove fully the conductive layer from the side surface of the projection while maintaining such a state that the side surface of the channel layer is completely covered with the gate electrode, because the conductive layer completely covers the side surface of the second semiconductor layer.

In the first manufacturing method, it is preferable that the first step includes a step of forming a heavily doped impurity layer located under the first semiconductor layer on the semiconductor substrate, and the third step includes a step of forming the insulating film made of a thermal oxide film at surfaces of the heavily doped impurity layer and the insular multilayered portion by effecting heat treatment on the semiconductor substrate, a thickness of a portion of the insulating film located at the sides of the first and third semiconductor layers of the insular multilayered portion being larger than that of a portion located at the side of the second semiconductor layer.

According to this manner in which the heat treatment is effected after forming the heavily doped impurity layer under the first semiconductor layer located on the semiconductor substrate, accelerated oxidation is carried out in the heavily doped impurity layer as well as the first and third semiconductor layers forming the source or drain. Therefore, a film thickness of the gate insulating film can be small, and a thickness of other insulating films can be large, so that a parasitic capacity of the gate electrode is reduced, and electrostatic destruction can be prevented.

In the first manufacturing method, the first step may preferably include a step of forming a lightly doped semiconductor layer doped lightly with impurity of the first conductivity type at a portion of each of the first and third semiconductor layers being in contact with the second semiconductor layer. This suppresses concentration of an electric field at a region of each channel layer near the drain layer, resulting in improvement of electrical characteristics.

In the first manufacturing method, the first step may include a step of ion-implanting impurity of the first conductivity type into the semiconductor substrate to form the first semiconductor layer; a step of effecting ion implantation multiple times for implanting impurity of the second conductivity type into the semiconductor substrate under different implantation conditions, and thereby forming the second semiconductor layer of which impurity distribution has a plurality of concentration peaks; and a step of ion-implanting impurity of the first conductivity type into the semiconductor substrate to form the third semiconductor layer on the second semiconductor layer.

According to this method, since the impurity distribution in the second semiconductor layer forming the channel has a plurality of concentration peaks, a uniform concentration of impurity is obtained in the channel layer.

In the first manufacturing method, the first step may preferably include a step, preceding the step of forming the first semiconductor layer, of forming a well layer doped with impurity of the second conductivity type at a region in the semiconductor substrate for forming the first semiconductor layer. This ensures formation of the well layer of the second conductivity type under the first semiconductor layer.

A second method of manufacturing a semiconductor device according to the invention comprises a first step of forming a first multilayered semiconductor layer formed on a region of a semiconductor substrate and including, in a successively layered fashion, a first semiconductor layer doped with impurity of a first conductivity type and forming a source or a drain, a second semiconductor layer doped with impurity of a second conductivity type and forming a channel, and a third semiconductor layer doped with impurity of the first conductivity type and forming the drain or the source, forming a second multilayered semiconductor layer formed on a different region of the semiconductor substrate and including, in a successively layered fashion, a fourth semiconductor layer doped with impurity of the second conductivity type and forming a source or a drain, a fifth semiconductor layer doped with impurity of the first conductivity type and forming a channel, and a sixth semiconductor layer doped with impurity of the second conductivity type and forming the drain or the source, subsequently effecting etching on the first, second and third semiconductor layers forming the first multilayered semiconductor layer to form a first insular multilayered portion formed of the first, second and third semiconductor layers on a region of the semiconductor substrate, and effecting etching on the fourth, fifth and sixth semiconductor layers forming the second multilayered semiconductor layer to form a second insular multilayered portion formed of the fourth, fifth and sixth semiconductor layers on a different region of the semiconductor substrate; a second step of forming a first insulating film covering the first insular multilayered portion, and forming a second insulating film covering the second insular multilayered portion; and a third step of forming a first gate electrode on a side surface of the second semiconductor layer with a first insulating film therebetween, and forming a second gate electrode on a side surface of the fourth semiconductor layer with a second insulating film therebetween.

According to the second method, the first insular multilayered portion is formed by etching the first multilayered semiconductor layer including, in a successively layered fashion, the first semiconductor layer forming the source or drain, the second semiconductor layer forming the channel and the third semiconductor layer forming the drain or source. Also, the second insular multilayered portion is formed by etching the second multilayered semiconductor layer including, in a successively layered fashion, the fourth semiconductor layer forming the source or drain, the fifth semiconductor layer forming the channel and the sixth semiconductor layer forming the drain or source. Therefore, each channel length can be controlled precisely. Also, areas of the first and fourth semiconductor layers, and hence an area of the semiconductor device can be small. Accordingly, the coupling capacity can be small, which allows high speed operation and further miniaturization of the semiconductor device.

In the second manufacturing method, the first step may include a step of forming a lower multilayered portion formed on the different region of the semiconductor substrate and including, in a successively layered fashion, a seventh semiconductor layer of the first conductivity type, an eighth semiconductor layer of the second conductivity type and a ninth semiconductor layer of the first conductivity type simultaneously with the step of forming the first, second and third semiconductor layers forming the first insular multilayered portion, and subsequently forming the second insular multilayered portion on the lower multilayered portion.

In this method, the lower multilayered portion including the seventh, eighth and ninth semiconductor layers is formed simultaneously with the step of forming the first, second and third semiconductor layers forming the first insular multilayered portion, and subsequently the second insular multilayered portion is formed on the lower multilayered portion. According to this method, the first and second insular multilayered portions are formed at different regions on the same semiconductor substrate by an epitaxial growth method.

In the second manufacturing method, the first step may be carried out to form the fourth semiconductor layer at the same step as the second semiconductor layer and to form the fifth semiconductor layer at the same step as the third semiconductor layer.

According to this manner, the first and second insular multilayered portions can be formed at different regions on the same semiconductor substrate with fewer steps.

In the second manufacturing method, the first step may preferably include an insular portion forming step of effecting etching selectively on the second and third semiconductor layers forming the first multilayered semiconductor layer to form a first insular portion formed of the second and third semiconductor layers, and effecting etching selectively on the fifth and sixth semiconductor layers forming the second multilayered semiconductor layer to form a second insular portion formed of the fifth and sixth semiconductor layers; and a projection forming step of effecting etching selectively on the first semiconductor layer forming the first multilayered semiconductor layer to form a first projection formed of the first semiconductor layer and projected beyond the second semiconductor layer of the first insular portion in a surface direction of the substrate, and effecting etching selectively on the fourth semiconductor layer forming the second multilayered semiconductor layer to form a second projection formed of the fourth semiconductor layer and projected beyond the fifth semiconductor layer of the second insular portion in the surface direction of the substrate.

According to this manner, there are formed the first projection which is formed of the first semiconductor layer and projects beyond the second semiconductor layer in the substrate surface direction as well as the second projection which is formed of the fourth semiconductor layer and projects beyond the fifth semiconductor layer in the substrate surface direction. Therefore, the first and second projections can be used as lead electrodes.

In this case, the projection forming step may preferably be carried out such that the first projection has a thickness smaller than a thickness of the third semiconductor layer and the second projection has a thickness smaller than a thickness of the sixth semiconductor layer.

This method offers the following advantage in such processing that a conductive layer entirely covering the first and second insular multilayered portions is formed and then is anisotropically etched to form the first and second gate electrodes. Since the thicknesses of the first and second projections are smaller than the thicknesses of the third and sixth semiconductor layers, respectively, overetching can be effected to remove fully the conductive layer from the side surfaces of the first and second projections while maintaining such a state that the side surface of each channel layer is completely covered with the gate electrode, because the conductive layer completely covers the side surfaces of the second and fifth semiconductor layers.

In the second manufacturing method, it is preferable that the first step includes a step of forming a first heavily doped impurity layer located under the first semiconductor layer on a region of the semiconductor substrate, and forming a second heavily doped impurity layer located under the fourth semiconductor layer on a different region of the semiconductor substrate; and the second step includes a step of effecting heat treatment on the semiconductor substrate to form, at surfaces of the first heavily doped impurity layer and the first insular multilayered portion, a first insulating film made of a thermal oxide film and having a portion which is located at the sides of the first and third semiconductor layers of the first insular multilayered portion and has a thickness larger than that of a portion located at the side of the second semiconductor layer, and form, at surfaces of the second heavily doped impurity layer and the second insular multilayered portion, a second insulating film made of a thermal oxide film arid having a portion which is located at the sides of the fourth and sixth semiconductor layers of the second insular multilayered portion and has a thickness larger than that of a portion located at the side of the fifth semiconductor layer.

According to this manner in which the heat treatment is effected after forming the first and second heavily doped impurity layers located under the first and second semiconductor layers on the semiconductor substrate, respectively, accelerated oxidation is carried out in the first and second heavily doped impurity layers as well as the first, third, fourth and sixth semiconductor layers forming the source or drain. Therefore, a film thickness of the first and second gate insulating films can be small, and a thickness of other insulating films can be large, so that a parasitic capacity of the first and second gate electrodes is reduced, and electrostatic destruction in the other insulating films can be prevented.

In the second manufacturing method, the first step may preferably include a step of forming a lightly doped semiconductor layer doped lightly with impurity of the first conductivity type at a region of each of the first and third semiconductor layers being in contact with the second semiconductor layer, and forming a lightly doped semiconductor layer doped lightly with impurity of the second conductivity type at a region of each of the fourth and sixth semiconductor layers being in contact with the fifth semiconductor layer. This suppresses concentration of an electric field at a region of each channel layer near the drain layer, resulting in improvement of electrical characteristics of the semiconductor device.

In the second manufacturing method, the first step may include the steps of forming the first semiconductor layer on a region of the semiconductor substrate, forming the second semiconductor layer on the first semiconductor layer, forming the third semiconductor layer on the second semiconductor layer, forming the fourth semiconductor layer on a region of the semiconductor substrate at a side of the first semiconductor layer, forming the fifth semiconductor layer on the fourth semiconductor layer, and forming the sixth semiconductor layer on the fifth semiconductor layer.

Thereby, p-channel and n-channel MOSFETs can be disposed substantially at the same level, so that a height of the semiconductor device having a CMOS circuit can be small.

In the second manufacturing method, the first step may preferably include a step, preceding the step of forming the first semiconductor layer, of forming a first well layer doped with impurity of the second conductivity type at a region in the semiconductor substrate for forming the first semiconductor layer, and a step, preceding the step of forming the fourth semiconductor layer, of forming a second well layer doped with impurity of the first conductivity type at a region in the semiconductor substrate for forming the fourth semiconductor layer. This ensures formation of the well layers under the first and fourth semiconductor layers, respectively.

A third method of manufacturing a semiconductor device according to the invention includes a first step of forming a multilayered semiconductor layer formed on a semiconductor substrate and including, in a successively layered fashion, a first semiconductor layer doped with impurity of a first conductivity type and forming a source or a drain, a second semiconductor layer doped with impurity of a second conductivity type and forming a channel, a third semiconductor layer doped with impurity of the first conductivity type and forming the drain or the source, a fourth semiconductor layer doped with impurity of the second conductivity type and forming a source or a drain, a fifth semiconductor layer doped with impurity of the first conductivity type and forming a channel, and a sixth semiconductor layer doped with impurity of the second conductivity type and forming the drain or the source, a second step of effecting etching on the first, second, third, fourth, fifth and sixth semiconductor layers forming the multilayered semiconductor layer to form an insular multilayered portion formed of the first, second, third, fourth, fifth and sixth semiconductor layers; a third step of forming an insulating film covering the insular multilayered portion; and a fourth step of forming a gate electrode on each of side surfaces of the second and fifth semiconductor layers with the insulating film therebetween.

According to the third method, the insular multilayered portion formed of the first to sixth semiconductor layers is formed by etching the multilayered semiconductor layer formed of the first to sixth semiconductor layers. Therefore, an MOSFET of the first polarity and an MOSFET of the second polarity are vertically layered, so that an area occupied by the semiconductor device can be small.

In the third manufacturing method, the second step may preferably include a first insular portion forming step of effecting etching selectively on the fifth and sixth semiconductor layers to form a first insular portion formed of the fifth and sixth semiconductor layers; a first projection forming step of effecting etching selectively on the fourth semiconductor layer to form a first projection formed of the fourth semiconductor layer and projected beyond the fifth semiconductor layer of the first insular portion in a surface direction of the substrate; a second insular portion forming step of effecting etching selectively on the second and third semiconductor layers to form a second insular portion formed of the second, third, fourth, fifth and sixth semiconductor layers; and a second projection forming step of effecting etching selectively on the first semiconductor layer to form a second projection formed of the first semiconductor layer and projected beyond the second semiconductor layer of the second insular portion in the surface direction of the substrate.

According to this manner, there are formed the first projection which is formed of the fourth semiconductor layer and projects beyond the fifth semiconductor layer in the substrate surface direction as well as the second projection which is formed of the first semiconductor layer and projects beyond the second semiconductor layer in the substrate surface direction. Therefore, the first projection can be used as a lead electrode of the fourth semiconductor layer, and the second projection can be used as a lead electrode of the first semiconductor layer.

The first projection forming step may preferably be carried out such that the first projection has a thickness smaller than a thickness of the third semiconductor layer, and the second projection forming step may preferably be carried out such that the second projection has a thickness smaller than a thickness of the sixth semiconductor layer.

This method offers the following advantage in such processing that a conductive layer entirely covering the second insular multilayered portion and the second projection is formed and then is anisotropically etched to form the first and second gate electrodes. Since the thicknesses of the first and second projections are smaller than the thicknesses of the third and sixth semiconductor layers, respectively, overetching can be effected to remove fully the conductive layer from the side surfaces of the first and second projections while maintaining such a state that the side surface of each channel layer is completely covered with the gate electrode, because the conductive layer completely covers the side surfaces of the second and fifth semiconductor layers.

In the third manufacturing method, it is preferable that the first step includes a step of forming a heavily doped impurity layer located under the first semiconductor layer on the semiconductor substrate; and the third step includes a step of effecting heat treatment on the semiconductor substrate to form, at surfaces of the heavily doped impurity layer and the insular multilayered portion, an insulating film made of a thermal oxide film and having a portion which is located at the sides of the first, third, fourth and sixth semiconductor layers of the insular multilayered portion and has a thickness larger than that of a portion located at the sides of the second and fifth semiconductor layers.

According to this manner in which the heat treatment is effected after forming the heavily doped impurity layer located under the first semiconductor layer on the semiconductor substrate, accelerated oxidation is carried out in the heavily doped impurity layer as well as the first, third, fourth and sixth semiconductor layers forming the source or drain. Therefore, a film thickness of the first and second gate insulating films can be small, and a thickness of other insulating films can be large.

In the third manufacturing method, the first step may preferably include a step of forming a lightly doped semiconductor layer doped lightly with impurity of the first conductivity type at regions of the first and third semiconductor layers being in contact with the second semiconductor layer, and forming a lightly doped semiconductor layer doped lightly with impurity of the second conductivity type at regions of the fourth and sixth semiconductor layers being in contact with the fifth semiconductor layer. This suppresses concentration of an electric field at a region of each channel layer near the drain layer, so that the semiconductor device of which electrical characteristics are improved can be produced.

Other objects, features, and advantages of the invention will appear more fully from the following detailed description thereof taken in connection with the accompanying drawings.

DESCRIPTION OF THE PREFERRED EMBODIMENTS

Figure 1A:
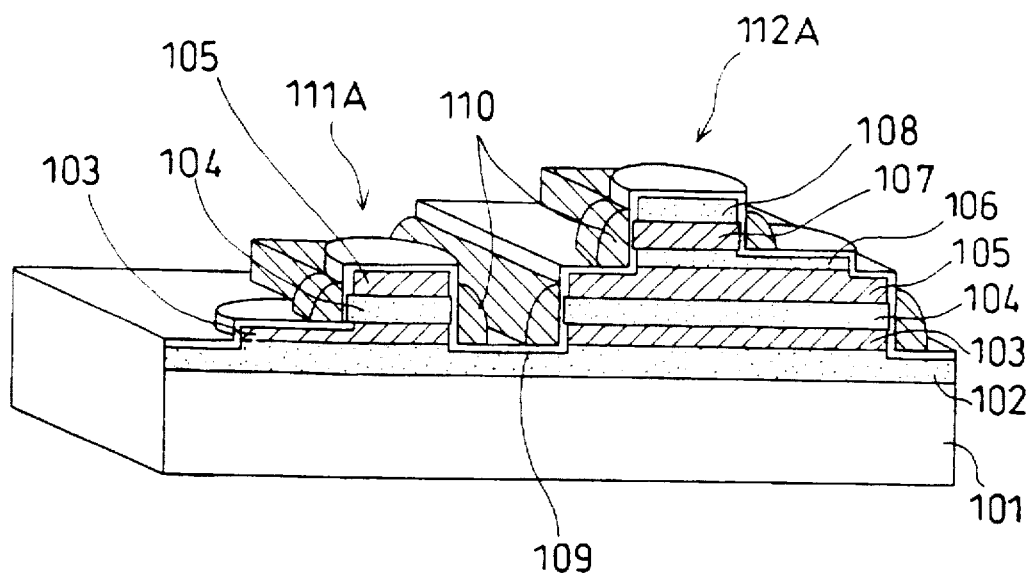
FIG. 1 shows, at (a) and (b) which are a perspective sectional view and a plan, respectively, a CMOSFET and a CMOS inverter of a first embodiment of the invention.
Figure 1B:
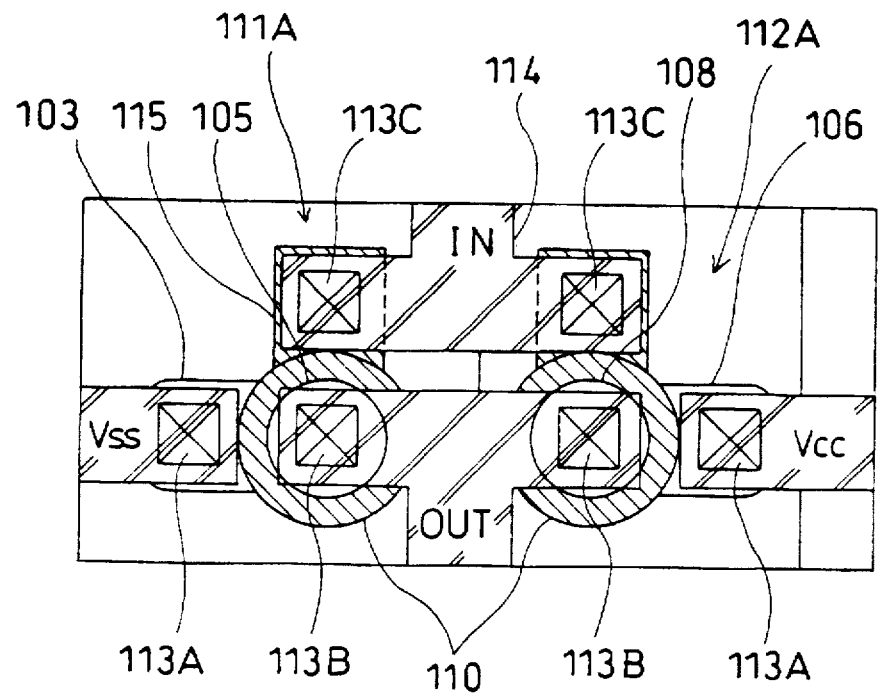

FIG. 1 shows, at (a) and (b), a CMOSFET and a CMOS inverter of a first embodiment of the invention. More specifically, FIG. 1 shows at (a) a perspective cross section of an n-channel MOSFET 111A and a p-channel MOSFET 112A immediately after formation of gate electrodes, and shows, at (b), a plan view for showing a manner of interconnection in the n-channel MOSFET and the p-channel MOSFET when the CMOS inverter is formed.

At (a) in FIG. 1, there is provided a semiconductor substrate 101 made of p-type (100) silicon. On the semiconductor substrate 101, there are successively formed or layered, by an epitaxial growth method, a first p-type silicon semiconductor layer 102 having a film thickness of 200 nm, a pair of first n-type silicon semiconductor layers 103 having a film thickness of 100 nm, a pair of second p-type silicon semiconductor layers 104 having a film thickness of 150 nm, a pair of second n-type silicon semiconductor layers 105 having a film thickness of 200 nm, a third p-type silicon semiconductor layer 106 having a film thickness of 100 nm, a third n-type silicon semiconductor layer 107 having a film thickness of 150 nm, and a fourth p-type silicon semiconductor layer 108 having a film thickness of 200 nm.

The first n-type silicon semiconductor layer 103, the second p-type silicon semiconductor layer 104 and the second n-type silicon semiconductor layer 105, which are shown on the left side at (a) in FIG. 1, form a first insular multilayered portion having a circular cross section. The n-channel MOSFET 111A is formed of the first n-type silicon semiconductor layer 103 forming a source, the second p-type silicon semiconductor layer 104 forming a channel, and the second n-type silicon semiconductor layer 105 forming a drain. The first n-type silicon semiconductor layer 103, the second p-type silicon semiconductor layer 104, the second n-type silicon semiconductor layer 105, the third p-type silicon semiconductor layer 106, the third n-type silicon semiconductor layer 107 and the fourth p-type silicon semiconductor layer 108, which are shown on the right side at (a) in FIG. 1, form a second insular multilayered portion having a circular cross section. The p-channel MOSFET 112A is formed of the third p-type silicon semiconductor layer 106 forming a source, the third n-type silicon semiconductor layer 107 forming a channel, and the fourth p-type silicon semiconductor layer forming a drain.

The first n-type silicon semiconductor layer 103, the second n-type silicon semiconductor layer 105 and the third n-type silicon semiconductor layer 107 contain impurity (boron) at concentrations of $4E20cm^{-3}$, $4E20cm^{-3}$ and $1E18cm^{-3}$, respectively. The first p-type silicon semiconductor layer 102, the second p-type silicon semiconductor layer 104, the third p-type silicon semiconductor layer 106 and the fourth p-type silicon semiconductor layer 108 contain impurity (phosphorus) at concentration of $4E20cm^{-3}$, $1E18cm^{-3}$, $4E20cm^{-3}$ and $4E20cm^{-3}$, respectively. Thus, heavily doped impurity layers (of the concentration of $4E20cm^{-3}$) form the source/drain layers, and lightly doped impurity layers (of the concentration of $1E18cm^{-3}$) form the channel layers.

Figure 11A:
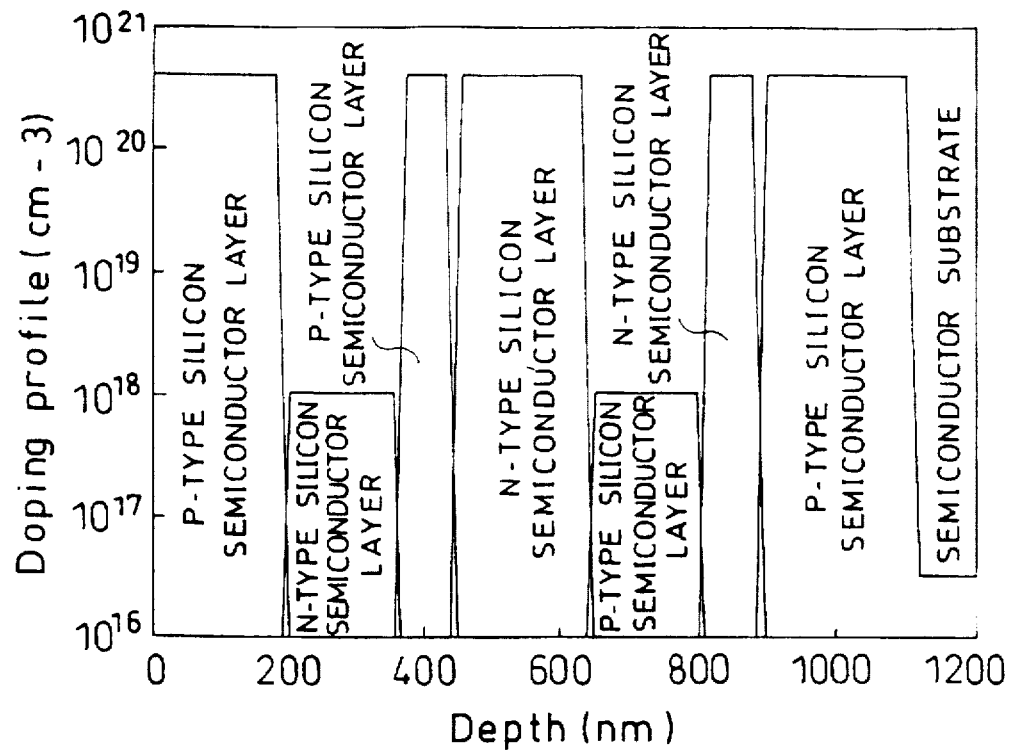
FIG. 11 shows, at (a) and (b), distribution of impurity at epitaxial layers in the CMOSFET and CMOS inverter of the first embodiment.
Figure 11B:
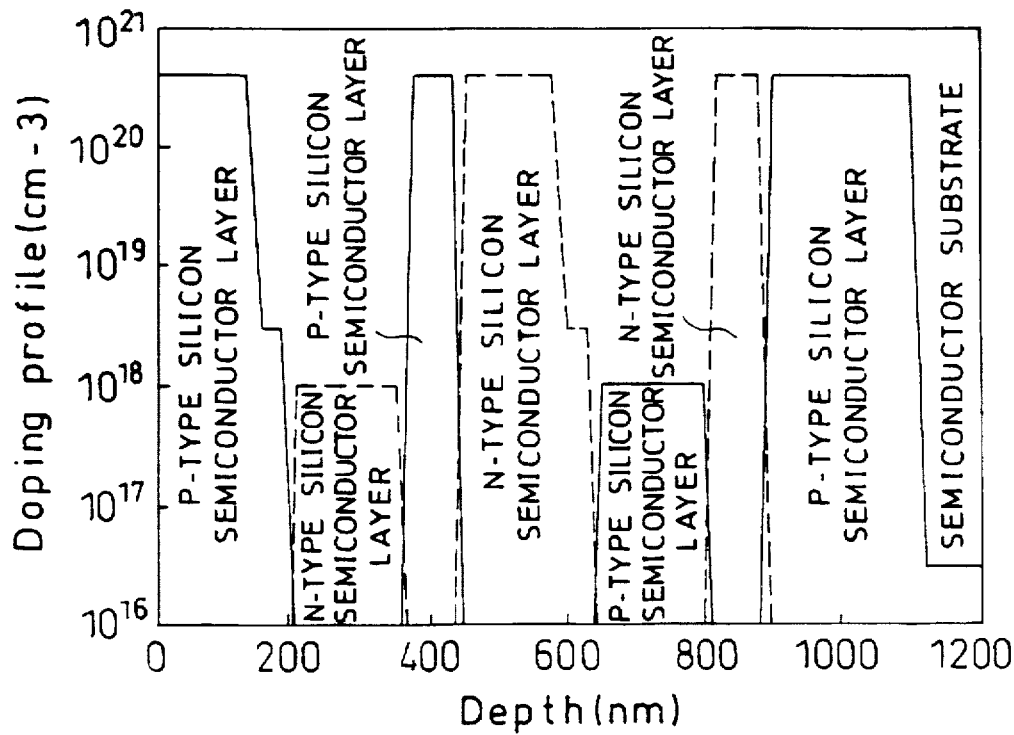
Figure 12A:
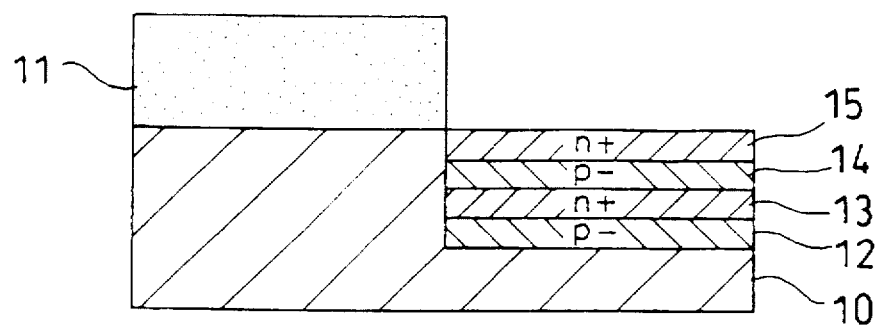
FIG. 12 shows, at (a)–(d), cross sections of a CMOSFET of a fourth embodiment at different steps in a manufacturing process.
Figure 12B:
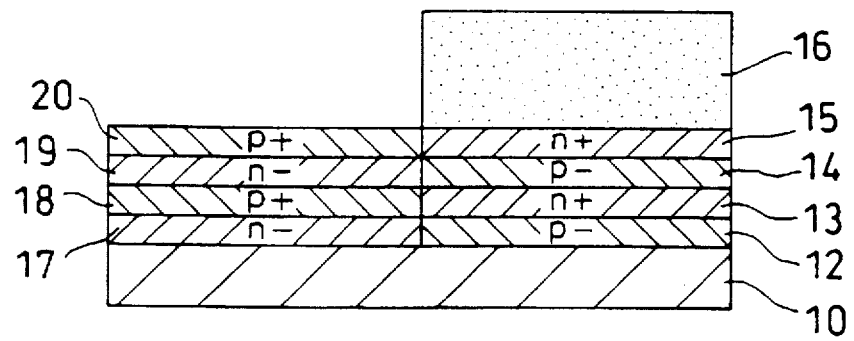
Figure 12C:
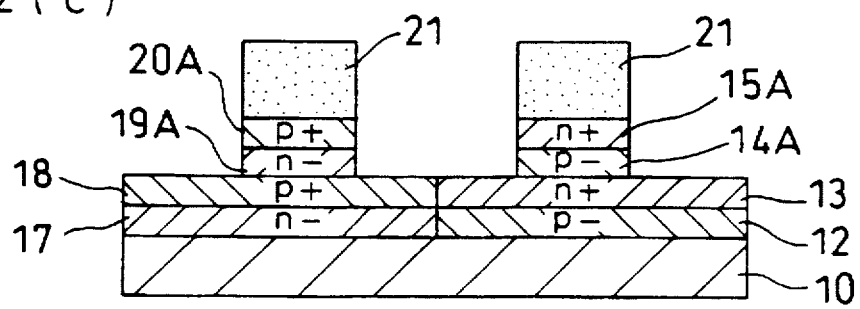
Figure 12D:
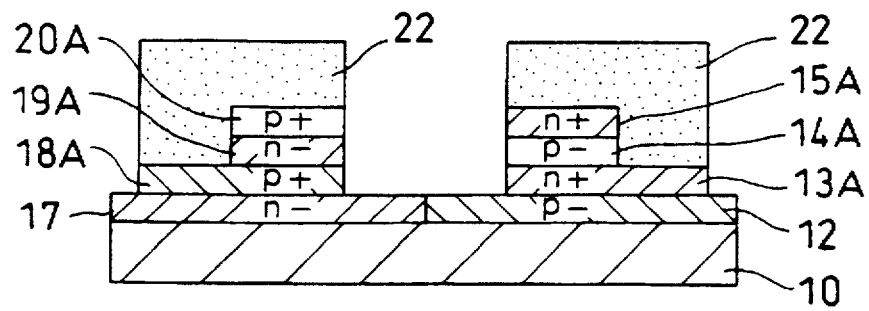

FIG. 11 shows at (a) distribution of the impurity concentration at respective semiconductor layers in a basic MOSFET. FIG. 11 shows at (b) distribution of the impurity concentration at respective semiconductor layers in an MOSFET having a so-called LDD (Lightly Doped Drain) structure in which the impurity concentration in the drain is low ($4E20cm^{-3}$) at a region near the channel layer. Similarly to the conventional self-aligned MOSFET, concentration of an electric field at the vicinity of the drain is suppressed, so that the MOSFET is improved in electrical characteristics.

Referring again to (a) in FIG. 1, at 109 is indicated a thermal oxide film entirely covering the respective semiconductor layers. The thermal oxide film 109 has portions, which cover the second p-type silicon semiconductor layers 104 and third n-type silicon semiconductor layer 107 and each form a gate oxide film of 4.5 nm in thickness, and also has a portion covering other semiconductor layers and having a film thickness of 30 nm. At 110 is indicated gate electrodes made of a polycrystalline silicon film or layer of 200 nm in thickness and covering peripheries of the second p-type silicon semiconductor layer 104 in the first insular multilayered portion and the third n-type silicon semiconductor layer 107 in the second insular multilayered portion, respectively. The polycrystalline silicon film at a lower position of the second insular multilayered portion 112A is not required, but is formed for certain reasons related to the manufacturing process.

In the first embodiment, since the first p-type silicon semiconductor layer 102, i.e., heavily doped impurity layer is grown on the silicon substrate 101, the thermal oxide film 109 can have a large film thickness at a portion other than a portion over the surfaces of the second p-type silicon semiconductor layer 104 and third n-type silicon semiconductor layer 107, so that a parasitic capacity of the gate electrode 110 can be reduced, and electrostatic destruction of the thermal oxide film at a portion other than the gate oxide film can be prevented.

An interlayer insulating film (now shown) having a film thickness of 400 nm is deposited on the whole surface of the thermal oxide film 109, and is provided with source electrode contacts 113A, drain electrode contacts 113B and gate electrode contact sll3C each having a side of 0.2 μm in length as shown at (b) in FIG. 1. A multilayered metal interconnection 114 made of TiN/AlCu/TiN/Ti is formed on the interlayer insulating film, whereby the CMOS inverter is completed. At 115 is indicated a lead of the gate electrode 110. The first n-type silicon semiconductor layers 103 are connected to an earth potential Vss. The third p-type silicon semiconductor layer 106 is connected to a power supply voltage Vcc. An input signal IN is applied to each of the gate electrodes 110 of the n-channel and p-channel MOSFETs 111A and 112A. An output signal OUT is formed potentials of the second n-type silicon semiconductor layer 105 and the fourth p-type silicon semiconductor layer 108 which are drains of the n-channel MOSFET 111A and the p-channel IOSFET 112A, respectively.

The drains are formed of the uppermost semiconductor layers of the n-channel and p-channel MOSFETs 111A and 112A for the reason that the uppermost semiconductor layers have a smaller parasitic capacity than the lower semiconductor layers, so that the operation speed and power consumption of the device can be improved.

Figure 2:
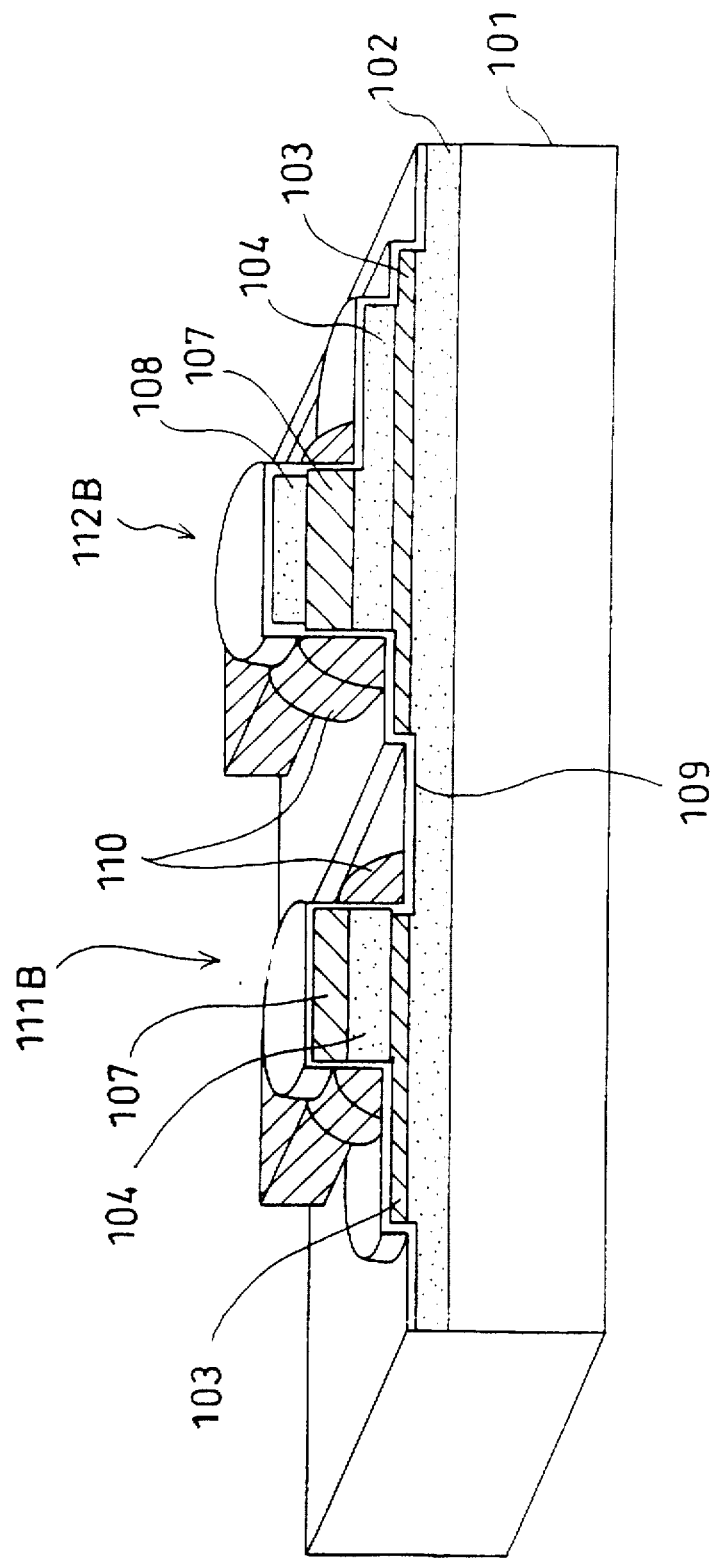
FIG. 2 is a perspective sectional view of a CMOSFET and a CMOS inverter of a second embodiment of the invention.

FIG. 2 is a perspective sectional view showing an n-channel MOSFET 111B and a p-channel MOSFET 112B immediately after formation of gate electrodes of a CMOSFET and a CMOS inverter of the second embodiment of the invention. In the second embodiment, a channel layer of the n-channel MOSFET 111B is commonly used as a source layer of the p-channel MOSFET 112B, and a drain layer of the n-channel MOSFET 111B is commonly used as a channel layer of the p-channel MOSFET 112B.

As shown in FIG. 2, there are formed on the semiconductor substrate 101, by the epitaxial growth method, the first p-type silicon semiconductor layer 102 having a film thickness of 150 nm, the paired first n-type silicon semiconductor layers 103 having a film thickness of 50 nm, the paired second p-type silicon semiconductor layers 104 having a film thickness of 150 nm, the paired third n-type silicon semiconductor layers 107 having a film thickness of 150 nm and the fourth p-type silicon semiconductor layer 108 having a film thickness of 150 nm. The second embodiment is not provided with the second n-type silicon semiconductor layer 105 and the third p-type silicon semiconductor layer 106.

On the left side in the figure, the first n-type silicon semiconductor layer 103 forming the source, the second p-type silicon semiconductor layer 104 forming the channel, and the third n-type silicon semiconductor layer 107 forming the drain form the n-channel MOSFET 112B. On the right side, the second p-type silicon semiconductor layer 104 forming the source, the third n-type silicon semiconductor layer 107 forming the channel and the fourth p-type silicon semiconductor layer 108 forming the drain form the p-channel MOSFET 112B.

The first n-type silicon semiconductor layer 103 and the third n-type silicon semiconductor layer 107 contain impurity (boron) at concentrations of $4E20cm^{-3}$ and $1E18cm^{-3}$, respectively. The first p-type silicon semiconductor layer 102, the second p-type silicon semiconductor layer 104 and the fourth p-type silicon semiconductor layer 108 contain the impurity (phosphorus) at concentrations of $4E20cm^{-3}$, $1E18cm^{-3}$ and $4E20cm^{-3}$, respectively. Thus, heavily doped impurity layers (of the concentration of $4E20cm^{-3}$) form the source/drain regions, and lightly doped impurity layers (of the concentration of $1E18cm^{-3}$) form the channel layer.

Referring to FIG. 2, at 109 is indicated the thermal oxide film entirely covering the respective semiconductor layers. The thermal oxide film 109 has portions, which cover the second p-type silicon semiconductor layers 104 and the third n-type silicon semiconductor layers 107 and form gate oxide films of 4.5 nm in thickness, and also has a portion covering other semiconductor layers and having a film thickness of 30 nm. At 110 is indicated the gate electrodes made of polycrystalline silicon films or layers of 200 nm in thickness and covering peripheries of the second p-type silicon semiconductor layer 104 in the first insular multilayered portion and the third n-type silicon semiconductor layer 107 in the second insular multilayered portion.

In the second embodiment, since the first p-type silicon semiconductor layer 102, i.e., heavily doped impurity layer is grown on the silicon substrate 101, the thermal oxide film 109 can have a large film thickness at a portion other than portions over the surfaces of the second p-type silicon semiconductor layer 104 and the third n-type silicon semiconductor layer 107, so that a parasitic capacity of the gate electrode 110 can be reduced, and electrostatic destruction of the thermal oxide film at portion other than the gate oxide film can be prevented.

In the second embodiment, the second p-type silicon semiconductor layers 104 are commonly used as the channel and the source, and the third n-type silicon semiconductor layers 107 are commonly used as the drain and the channel. For this purpose, the semiconductor layers contain impurity at a concentration which is insufficient for achieving ohmic contact. Therefore, at a step of forming an interconnection described later, a p-type diffusion layer 121 and an n-type diffusion layer 122, each of which contains impurity at a concentration of $4E20cm^{-3}$, are formed at the second p-type silicon semiconductor layer 104 and the third n-type silicon semiconductor layer 107 as shown at (d) in FIG. 7. This will be described further in detail with reference to (d) in FIG. 7 in connection with a manufacturing method of the second embodiment.

Figure 3:
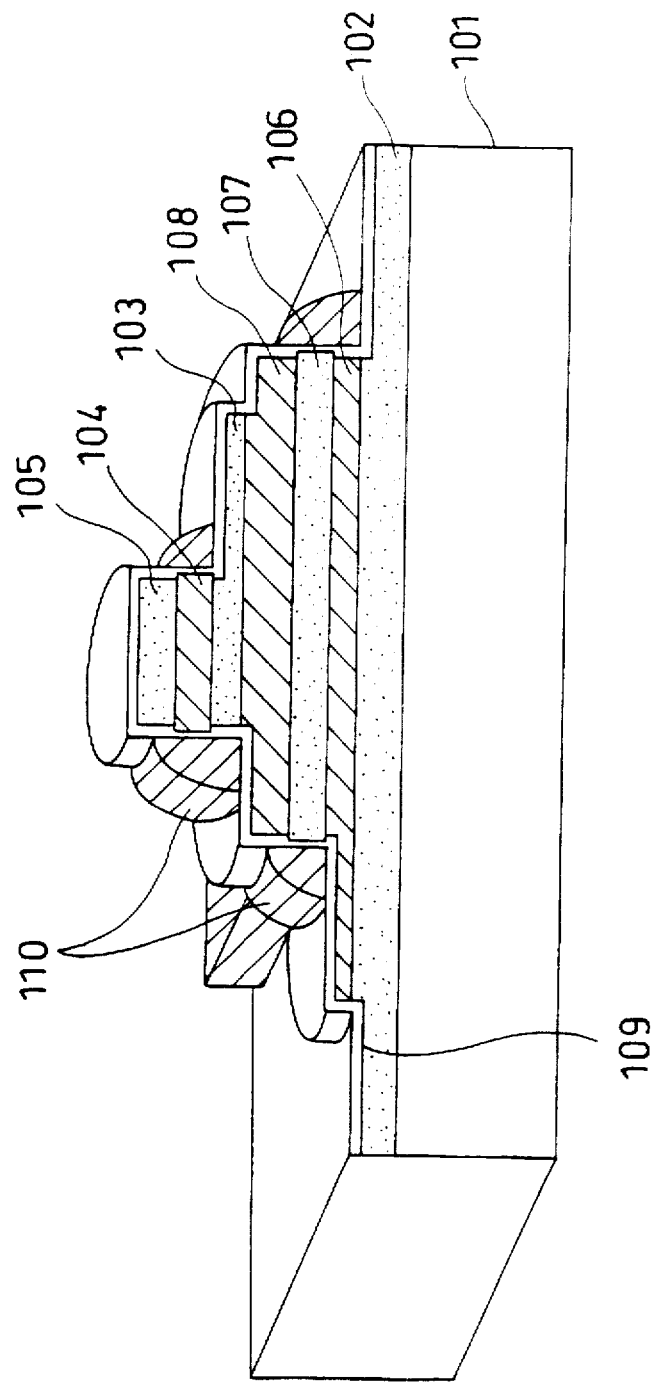
FIG. 3 is a perspective sectional view of a CMOSFET and a CMOS inverter of a third embodiment of the invention.
Figure 4A:
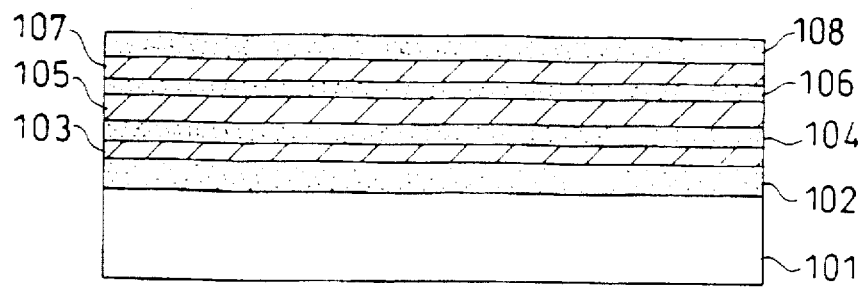
FIG. 4 shows, at (a)-(d), cross sections of the CMOSFET and CMOS inverter of the first embodiment at different steps in a manufacturing process.
Figure 4B:
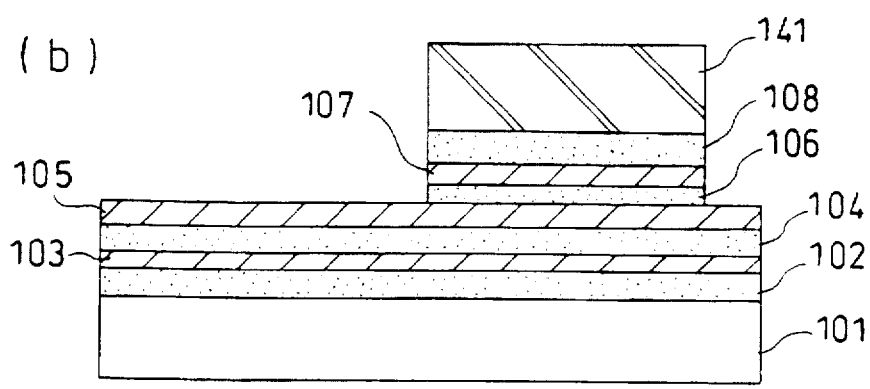
Figure 4C:
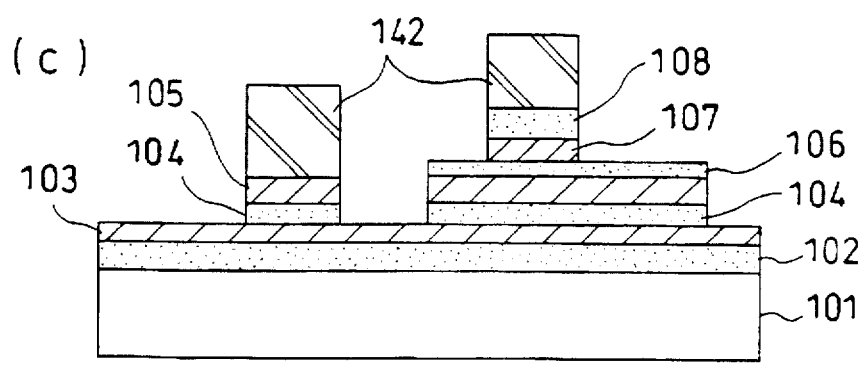
Figure 4D:
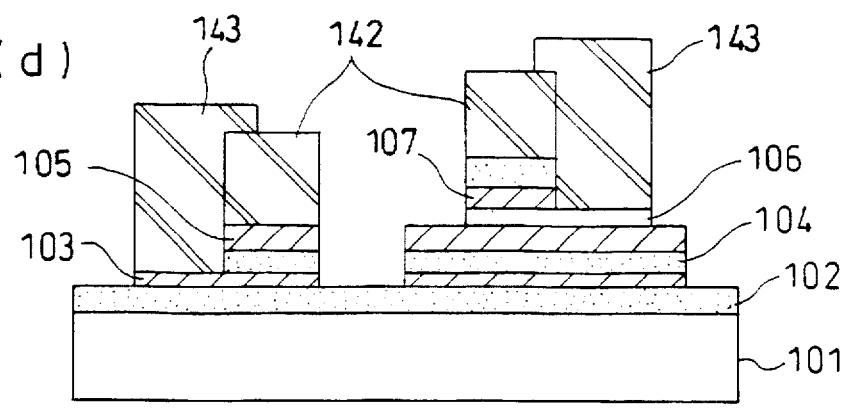

FIG. 3 is a perspective sectional view of a CMOSFET and a CMOS inverter of a third embodiment of the invention immediately after formation of a gate electrode. In the first and second embodiments, the n-channel MOSFET and the p-channel MOSFET form the insular multilayered portions independent from each other. In the third embodiment, the n-channel MOSFET and the p-channel MOSFET are vertically layered to form a single insular multilayered portion. This can reduce an area occupied by the inverter. In FIG. 3, the same portions and members as those in FIG. 1 bear the same reference numbers, and will not be described below.

According to the third embodiment, the MOSFET at the lower layer has a large area, and thus has a large gate width, so that it is preferable to dispose the p-channel MOSFET having a lower current drive capacity at the lower layer. Accordingly, as shown in FIG. 3, it is, of course, necessary to change the order of the layered epitaxial layers.

In the first to third embodiments, each gate electrode 110 is formed around the periphery of the channel, i.e., the second p-type silicon semiconductor layer 104 or the third n-type silicon semiconductor layer 107. However, the gate electrode may have a form not surrounding the channel layer.

The CMOSFETs and CMOS inverters in the first to third embodiments already described have the following various features.

(1) Since the vertical MOSFET structure is employed, the channel length depends on only the depth of the impurity layer. Therefore, it is possible to prevent such a disadvantage in the conventional self-aligned process that a processed size of the gate electrode made of a polycrystalline silicon layer affects the current drive capacity, so that such a problem can be prevented that it becomes more difficult to control the current drive capacity as the structure is miniaturized to a higher extent.

(2) Similarly to the SOI structure, expansion of the depletion layer is suppressed. (While the expansion is suppressed by an insulating film in the SOI structure, the expansion is suppressed when depletion layers extending from positions around the channel regions are connected together according to the structure of the invention.) More specifically, in the structure using the circular channel regions, the gate width is equal to $2\pi r$ (=2×(number p)×(radius of channel region)), and the depletable area is equal to $\pi r^2$ (=(number p)×(radius of channel region)$^2$), so that the depth of the channel region per length is equal to r/2 (=(radius of channel region)/2). In each of the embodiments already described, the depletion layer is formed only to an extent similar to that in the case of employing the SOI structure having a channel region of 0.1 μm in thickness. Therefore, the inverted layer can be formed easily, and thus the current drive capacity can be increased.

(3) By providing the first and second insular multilayered portions which are independent from each other and are formed by etching four or more semiconductor layers, it is possible to form the CMOS circuit which cannot be formed by the vertical MOSFET already proposed without difficulty.

(4) The channel region is spaced from the substrate, as is done in the SOI structure, so that a latch-up phenomenon does not occur, and a separation width between the nMOS and pMOSFET can be minimized.

(5) In the structure including the CMOS inverter, the respective drains are formed of the uppermost semiconductor layers of the n-channel and p-channel MOSFETs, i.e., the layers of which parasitic capacities are small, whereby the operation speed and power consumption of the device can be improved. The layered structure of the n-channel and p-channel MOSFETs can reduce an area occupied by the inverter.

(6) The thermal oxide film 109 has a larger thickness at the portion other than the surfaces of the second p-type - on semiconductor layer 104 and the third n-type silicon semiconductor layer 107. This reduces the parasitic capacity of the gate electrode 110, and prevents electrostatic destruction of the the mal oxide film at the portion other than the gate oxide film.

Figure 5A:
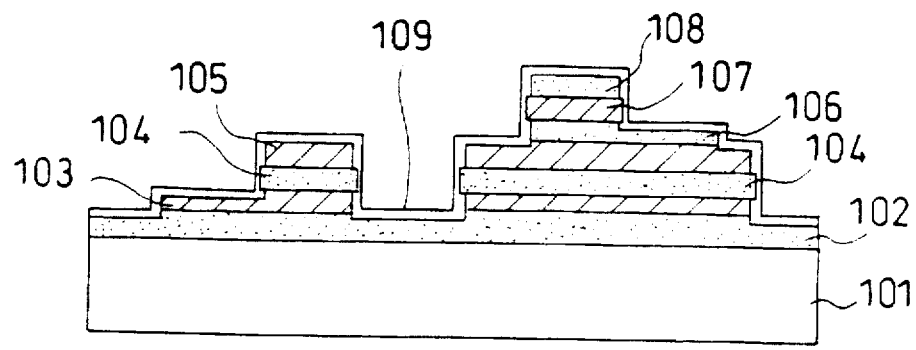
FIG. 5 shows, at (a)–(c), cross sections of the CMOSFET and CMOS inverter of the first embodiment at different steps in a manufacturing process.
Figure 5B:
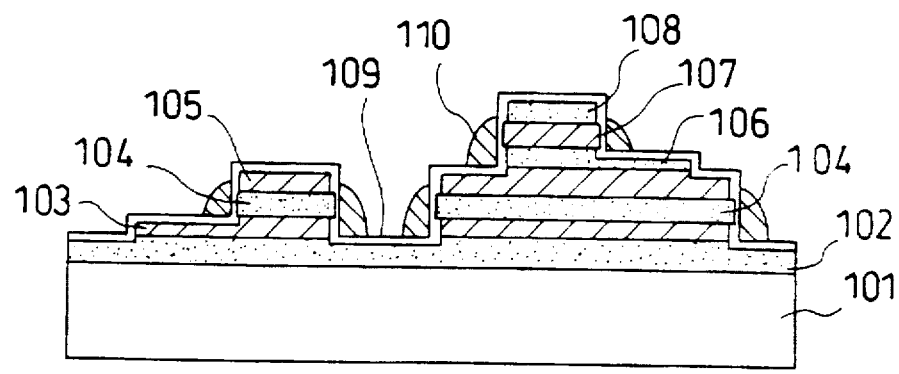
Figure 5C:
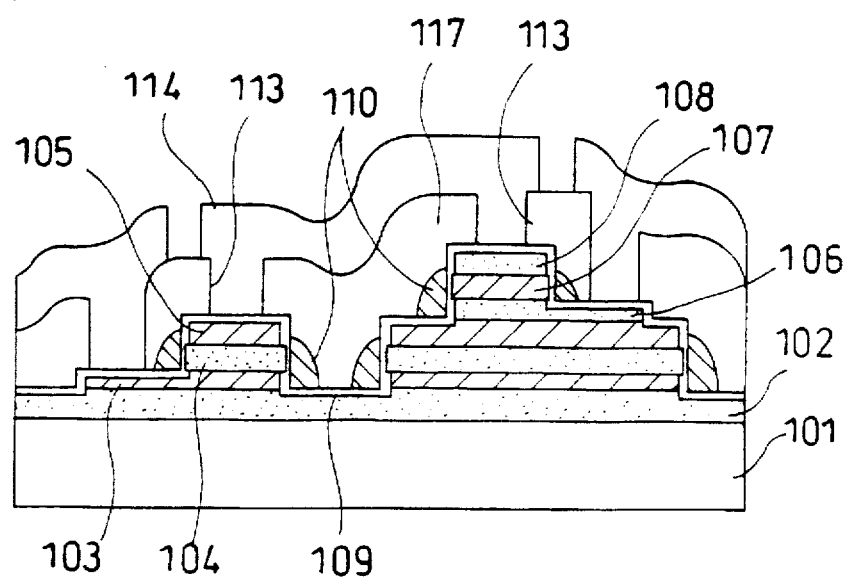
Figure 6A:
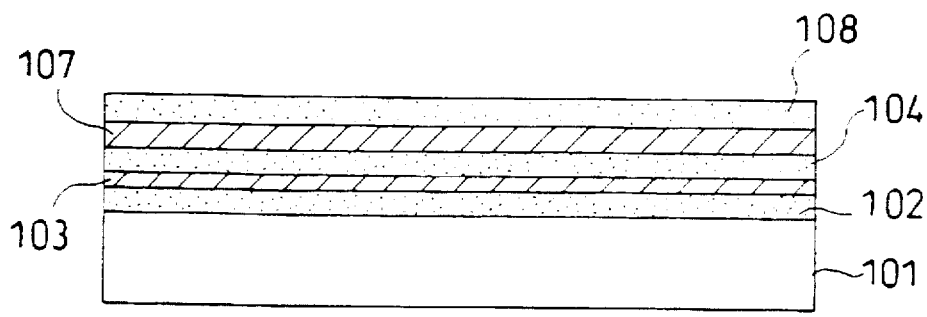
FIG. 6 shows, at (a)–(d), cross sections of the CMOSFET and the CMOS inverter of the second embodiment at different steps in a manufacturing process.
Figure 6B:
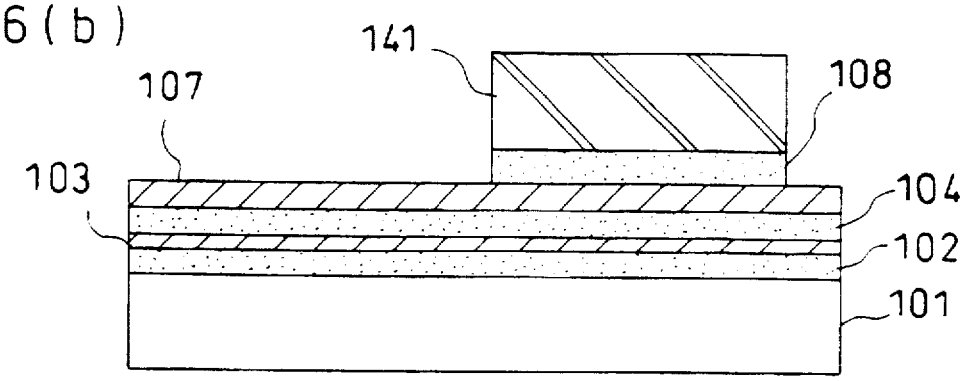
Figure 6C:
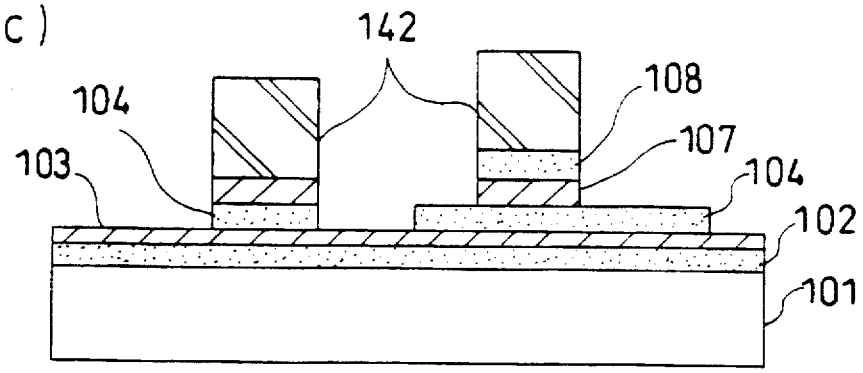
Figure 6D:
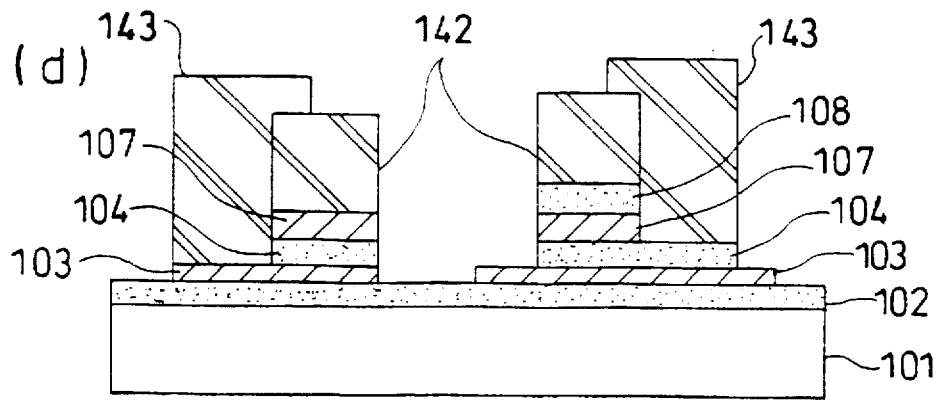
Figure 7A:
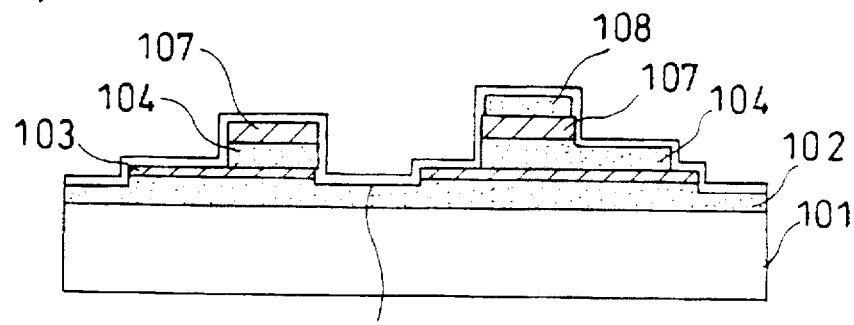
FIG. 7 shows, at (a)–(d), cross sections of the CMOSFET and the CMOS inverter of the second embodiment at different steps in the manufacturing process.
Figure 7B:
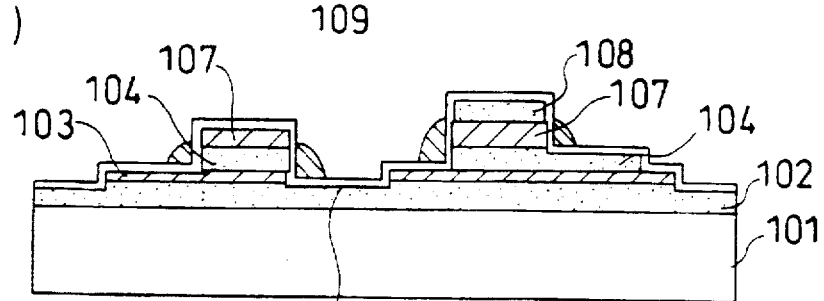
Figure 7C:
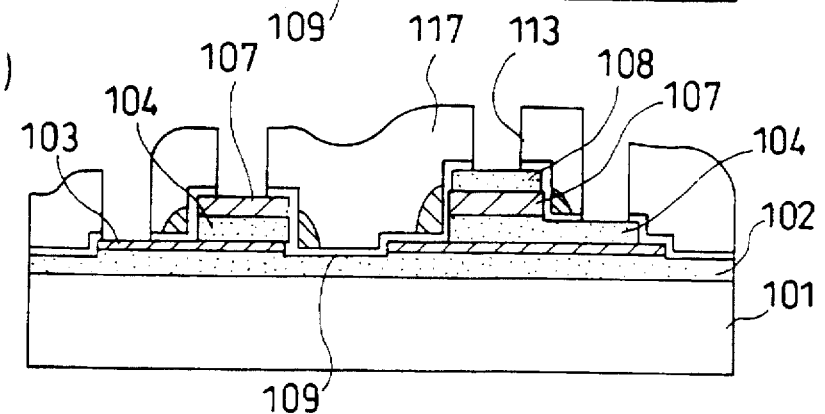
Figure 7D:
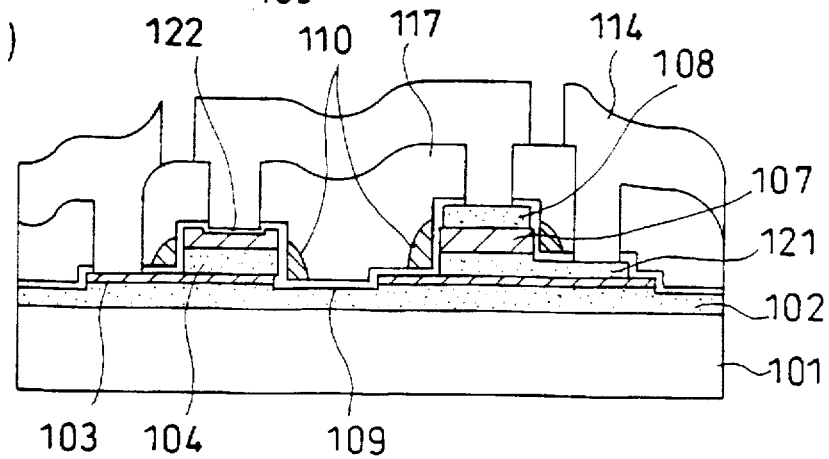

Referring to FIGS. 4 and 5, a method of manufacturing the CMOSFET and CMOS inverter of the first embodiment will be described below.

As shown at (a) in FIG. 4, the epitaxial growth method is carried out to form successively on the p-type (100) silicon substrate 101 the first p-type silicon semiconductor layer 102 of 200 nm in thickness, the first n-type silicon semiconductor layer 103 of 100 nm in thickness, the second p-type silicon semiconductor layer 104 of 150 nm in thickness, the second n-type silicon semiconductor layer 105 of 200 nm in thickness, the third p-type silicon semiconductor layer 106 of 100 nm in thickness, the third n-type silicon semiconductor layer 107 of 150 nm in thickness and the fourth p-type silicon semiconductor layer 108 of 200 nm in thickness.

Here, the epitaxial growth method is specifically a high-vacuum CVD method. The first, second and third n-type silicon semiconductor layers 103, 105 and 107 are formed under the process conditions that a growth temperature is 600° C., dopant is $B_2H_6$ with base of H2 at 90 ppm, and a CVD gas is silane. The first, second, third and fourth p-type silicon semiconductor layers 102, 104, 106 and 108 are formed under the process conditions that a growth temperature is 600° C., dopant is $PH_3$ with base of $H_2$ at 90 ppm, and a CVD gas is silane. The concentrations of impurity (boron) in the first, second and third n-type silicon semiconductor layers 103, 105 and 107 are $4E20cm^{-3}$, $4E20cm^{-3}$ and $1E18cm^{-3}$, respectively. The concentrations of impurity (phosphorus) in the first, second, third and fourth p-type silicon semiconductor layers 102, 104, 106 and 108 are $4E20cm^{-3}$, $1E18cm^{-3}$, $4E20cm^{-3}$ and $4E20cm^{-3}$, respectively. The heavily doped impurity layers (of the concentration of $4E20cm^{-3}$) form the source/drain layers, and the lightly doped impurity layers (of the concentration of $1E18cm^{-3}$) form the channel layers.

As shown at (b) in FIG. 4, after covering the surface of the substrate, which will form the p-channel MOSFET, with a first photoresist 141, anisotropic etching is effected by RIE (Reactive Ion Etching) on the fourth p-type silicon semiconductor layer 108, the third n-type silicon semiconductor layer 107 and the third p-type silicon semiconductor layer 106 using the first photoresist 141 as a mask. The exposing device used in this process is an ArF excimer exposing device. The etching device used in this process is an LEP device. The etching conditions are, for example, as follows:

$Cl_2$: 60 sccm
$O_2$: 3 sccm
Pressure: 1 Pa
LEP Power: 100 W
Bias Power: 100 W

Luminescence of impurity, i.e., phosphorus and boron is detected for precise termination of the etching.

As shown at (c) in FIG. 4, after removing the first photoresist 141, a second photoresist 142 is formed to cover the respective channel regions of the n-channel and p-channel MOSFETs, and then, using the second photoresist 142 as an etching mask, anisotropic etching is effected in the RIE method on the fourth p-type silicon semiconductor layer 108, third n-type silicon semiconductor layer 107, second n-type silicon semiconductor layer 105 and second p-type silicon semiconductor layer 104. The etching device and the etching conditions are the same as those already described. The side walls of the semiconductor layers on which the above etching is effected will form interfaces between the oxide film and silicon of the MOS transistor. Therefore, deposition of the film on the side wall must be suppressed as far as possible. Accordingly, the LEP etching device capable of suppressing the film deposition is used, and the etching is carried out with a chlorine gas under a high vacuum condition.

As shown at (d) in FIG. 4, after forming a third photoresist 143 covering the respective source regions of the n-channel and p-channel MOSFETs, anisotropic etching is effected in the RIE method on the third p-type silicon semiconductor layer 106 and first n-type silicon semiconductor layer 103 using the second and third photoresists 142 and 143 as an etching mask. The etching device and the etching conditions are the same as those already described. This etching forms the first insular multilayered portion which forms the n-channel MOSFET formed of the first n-type silicon semiconductor layer 103, the second p-type silicon semiconductor layer 104 and the second n-type silicon semiconductor layer 105 as well as the second insular multilayered portion which forms the p-channel MOSFET formed of the third p-type silicon semiconductor layer 106, the third n-type silicon semiconductor layer 107 and the fourth p-type silicon semiconductor layer 108.

As shown at (a) in FIG. 5, after removing the second and third photoresists 142 and 143, dry oxidization is carried out to form the thermal oxide film 109 on the whole surface of the semiconductor layers. This processing forms the thermal oxide film 109 having a film thickness of 4.5 nm and forming the gate oxide film on the surfaces of the third n-type silicon semiconductor layer 107 and the second p-type silicon semiconductor layer 104 forming the channel regions, and also forms, by accelerated oxidization, the thick thermal oxide film 109 of 30 nm in thickness on the surfaces of the heavily doped impurity layers, i.e., the first p-type silicon semiconductor layer 102, the first n-type silicon semiconductor layer 103, the second n-type silicon semiconductor layer 105, the third p-type silicon semiconductor layer 106 and the fourth p-type silicon semiconductor layer 108. The reason for growing the first p-type silicon semiconductor layer 102, which is the heavily doped impurity layer other than the source/drain layers, on the silicon substrate 101 is as follows. In the step of forming the thermal oxide film 109, the etched bottom is defined as the heavily doped impurity layer, whereby the thermal oxide film 109 is formed by accelerated oxidization to have a thick portion entirely at the area which is in contact with the gate electrode 110 but does not cover the surfaces of the third n-type silicon semiconductor layer 107 and the second p-type silicon semiconductor layer 104, so that the parasitic capacities between the gate electrode 110 and the respective semiconductor layers can be reduced, and the electrostatic destruction of the thermal oxide film 109 at the portion other than the gate oxide film can be prevented.

After depositing a polycrystalline silicon film of 200 nm in thickness on the whole surface of silicon substrate 101 by the LP-CVD method, a fourth photoresist (not shown) is formed on the polycrystalline silicon film to cover a lead 115 (see (b) in FIG. 1) of the gate electrode 110, and then anisotropic etching is effected in the RIE method on the polycrystalline silicon film using the fourth photoresist as an etching mask. Thereby, as shown at (b) in FIG. 5, the gate electrodes 110 surrounding the third n-type silicon semiconductor layer 107 and the second p-type silicon semiconductor layer 104 as well as the lead 115 are formed. In this case, the anisotropic etching effects the overetching of about 60% on the polycrystalline silicon film by the following reason. If the overetching of about 20% were carried out, portions 116 of the polycrystalline silicon film would remain around the third p-type silicon semiconductor layer 106 and the first n-type silicon semiconductor layer 103. These residual portions 116 of the polycrystalline silicon film would be connected to the gate electrodes 110, so that the gate capacity would unpreferably increase and hence the device speed would be reduced.

Figure 8:
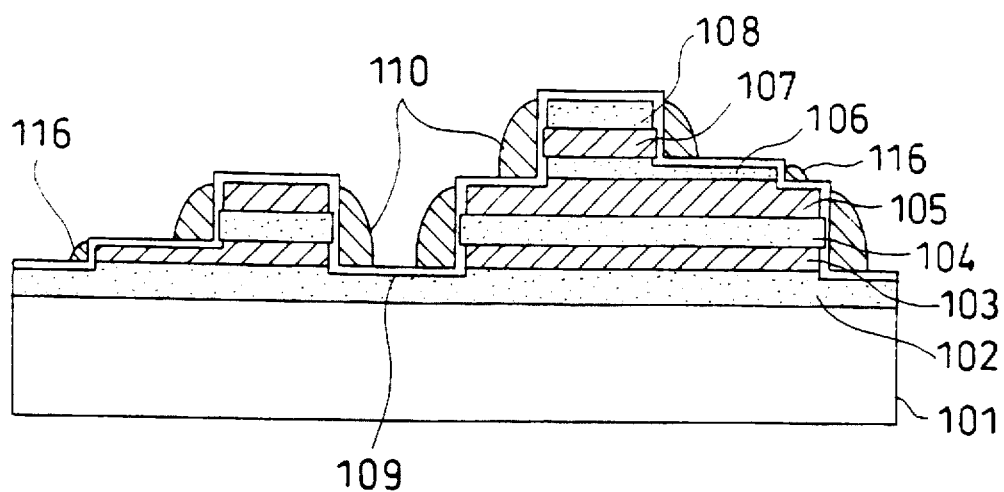
FIG. 8 is a cross section showing a problem caused by inappropriate etching to be performed for forming a gate electrode in a method of manufacturing the CMOSFET and CMOS inverter of the first embodiment.
Figure 9:
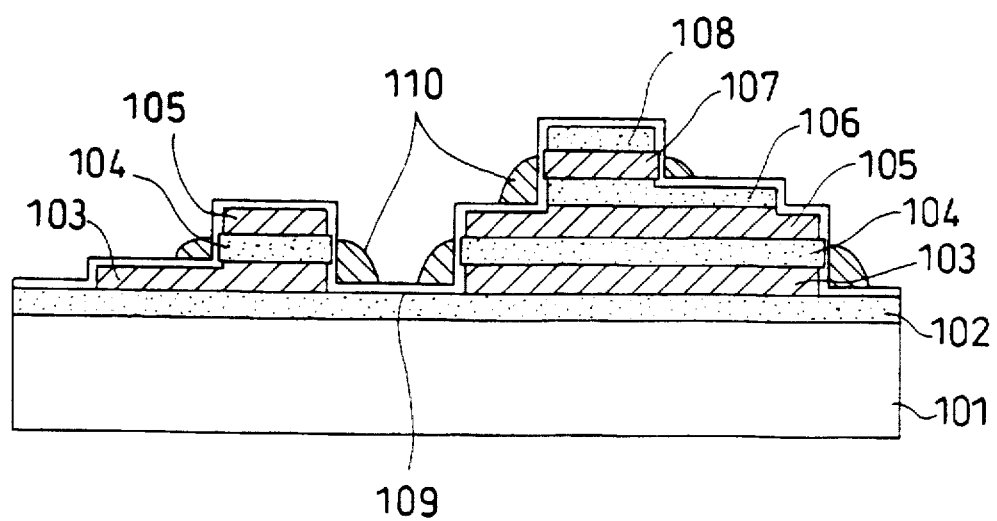
FIG. 9 is a cross section showing a problem caused in the case where each semiconductor layer has an inappropriately thickness in a method of manufacturing the CMOSFET and CMOS inverter of the first embodiment.

Now, description will be given on the reason for which the second n-type silicon semiconductor layer 105 and the fourth p-type silicon semiconductor layer 108 have a film thickness larger than that of other semiconductor layers. If all the semiconductor layers had the equal film thickness of 150nm, it would be necessary to effect overetching of 85%, i.e., by a thickness corresponding to the thickness of the third p-type silicon semiconductor layer 106 and the first n-type silicon semiconductor layer 103 in order to prevent the residual portions 116 (see FIG. 8) of the polycrystalline silicon film around the third p-type silicon semiconductor layer 106 and the first n-type silicon semiconductor layer 103. If the second n-type silicon semiconductor layer 105 and the fourth p-type silicon semiconductor layer 108 did not have a thickness larger than that of other semiconductor layers, the gate electrodes 110 would not sufficiently cover the peripheries of the channel layers, i.e., the third n-type silicon semiconductor layer 107 and the second p-type silicon semiconductor layer 104.

Figure 10:
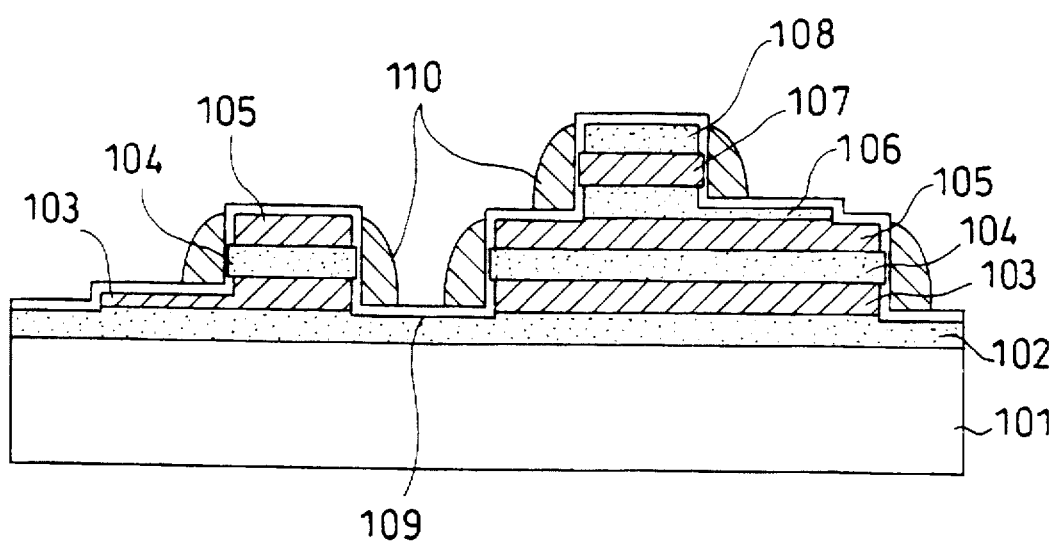
FIG. 10 is a cross section of a CMOSFET and a CMOS inverter of a modification of the first embodiment.

In stead of the structure in which the second n-type silicon semiconductor layer 105 and the fourth p-type silicon semiconductor layer 108 are thicker than the other semiconductor layers, such a structure shown in FIG. 10 may be employed that the third p-type silicon semiconductor layer 106 and the first n-type silicon semiconductor layer 103 are provided at portions extended beyond the third n-type silicon semiconductor layer 107 and the second p-type silicon semiconductor layer 104 with stepped portions having smaller thickness than the second n-type silicon semiconductor layer 105 and the fourth p-type silicon semiconductor layer 108, respectively. This structure can be formed at the step of effecting the anisotropic etching on the fourth p-type silicon semiconductor layer 108, the third n-type silicon semiconductor layer 107, the second n-type silicon semiconductor layer 105 and the second p-type silicon semiconductor layer 104 using the second photoresist 142 as an etching mask, as already described with reference to (c) in FIG. 4, and more specifically by effecting the overetching to an extent corresponding to about half the film thickness on the third p-type silicon semiconductor layer 106 and the first n-type silicon semiconductor layer 103. This prevents the residual portions 116 of the polycrystalline silicon film around the third p-type silicon semiconductor layer 106 and the first n-type silicon semiconductor layer 103.

As shown at (c) in FIG. 5, after depositing an interlayer insulating film 117 of 400 nm in thickness on the whole surface of the silicon substrate 101 by a known method, contact holes 113 of 0.25 μm in diameter are formed at the interlayer insulating film 117 for making contact with the source, the drain and the gate electrodes. Then, the multilayered metal interconnection 114 made of TiN/AlCu/TiN/Ti is formed.

Referring to FIGS. 6 and 7, a method of manufacturing the CMOSFET and CMOS inverter of the second embodiment will be described below.

As shown at (a) in FIG. 6, the epitaxial growth method is carried out to form successively on the p-type (100) silicon substrate 101 the first p-type silicon semiconductor layer 102 of 200 nm in thickness, the first n-type silicon semiconductor layer 103 of 50 nm in thickness, the second p-type silicon semiconductor layer 104 of 150 nm in thickness, the third n-type silicon semiconductor layer 107 of 150 nm in thickness and the fourth p-type silicon semiconductor layer 108 of 150 nm in thickness. The second n-type silicon semiconductor layer 105 and the third p-type silicon semiconductor layer 106 are not formed.

Similarly to the method already described, the high-vacuum CVD method is employed for the epitaxial growth. Also the process is carried out under the same conditions as those already described. The concentrations of impurity (boron) in the first and third n-type silicon semiconductor layers 103 and 107 are $4E20cm^{-3}$ and $1E18cm^{-3}$, respectively. The concentrations of impurity (phosphorus) in the second and fourth p-type silicon semiconductor layers 104 and 108 are $1E18cm^{-3}$ and $4E20cm^{-3}$, respectively. The heavily doped impurity layers (of the concentration of $4E20cm^{-3}$) form the source/drain layers, and the lightly doped impurity layers (of the concentration of $1E18cm^3$) form the channel layers.

As shown at (b) in FIG. 6, after covering the surface of the substrate, which will form the p-channel VIOSFET, with the first photoresist 141, anisotropic etching is effected by RIE on the fourth p-type silicon semiconductor layer 108 using the first photoresist 141 as an etching mask. The etching device and the etching conditions in this process are the same as those already described.

As shown at (c) in FIG. 6, after removing the first photoresist 141, the second photoresist 142 is formed to cover the respective channel regions of the n-channel and p-channel MOSFETs, and then, using the second photoresist 142 as an etching mask, anisotropic etching is effected in the RIE method on the fourth p-type silicon semiconductor layer 108, the third n-type silicon semiconductor layer 107 and the second p-type silicon semiconductor layer 104. The etching device and the etching conditions are the same as those already described.

As shown at (d) in FIG. 6, after forming the third photoresist 143 covering the respective source regions of the n-channel and p-channel MOSFETs, anisotropic etching is effected in the RIE method on the second p-type silicon semiconductor layer 104 and the first n-type silicon semiconductor layer 103 using the third photoresist 143 as an etching mask. The etching device and the etching conditions are the same as those already described. This etching forms the first insular multilayered portion which forms the n-channel MOSFET formed of the first n-type silicon semiconductor layer 103, the second p-type silicon semiconductor layer 104 and the third n-type silicon semiconductor layer 107 as well as the second insular multilayered portion which forms the p-channel MOSFET formed of the second p-type silicon semiconductor layer 104, the third n-type silicon semiconductor layer 107 and the fourth p-type silicon semiconductor layer 108.

As shown at (a) in FIG. 7, after removing the second and third photoresists 142 and 143, dry oxidization is carried out to form the thermal oxide film 109 on the whole surface of the semiconductor layers. This processing forms the thermal oxide film 109 having a film thickness of 4.5 nm and forming the gate oxide film on the surfaces of the third n-type silicon semiconductor layer 107 and the second p-type silicon semiconductor layer 104 forming the channel regions, and also forms, by accelerated oxidization, the thick thermal oxide film 109 of 30 nm in thickness on the surfaces of the heavily doped impurity layers, i.e., the first p-type silicon semiconductor layer 102, the first n-type silicon semiconductor layer 103 and the fourth p-type silicon semiconductor layer 108. The reason for growing the first p-type silicon semiconductor layer 102, which is the heavily doped impurity layer other than the source/drain layers, on the silicon substrate 101 is as follows. In the step of forming the thermal oxide film 109, the etched bottom is defined as the heavily doped impurity layer, whereby the thermal oxide film 109 is formed by accelerated oxidization to have a thick portion entirely at the whole area which is in contact with the gate electrode 110 but does not cover the surfaces of the third n-type silicon semiconductor layer 107 and the second p-type silicon semiconductor layer 104, so that the parasitic capacities between the gate electrode 110 and the respective semiconductor layers can be reduced, and the electrostatic destruction of the thermal oxide film 109 at the portion other than the gate oxide film can be prevented.

After depositing a polycrystalline silicon film of 200 nm in thickness on the whole surface of the silicon substrate 101 by the LP-CVD method, the fourth photoresist (not shown) is formed on the polycrystalline silicon film to cover a lead (not shown) of the gate electrode 110, and then anisotropic etching is effected in the RIE method on the polycrystalline silicon film using the fourth photoresist as an etching mask. Thereby, as shown at (b) in FIG. 7, the gate electrodes 110 surrounding the second p-type silicon semiconductor layer 104 in the first insular multilayered portion and the third n-type silicon semiconductor layer 107 in the second insular multilayered portion as well as the lead (not shown) thereof are formed. In this case, the anisotropic etching effects the overetching of about 40% on the polycrystalline silicon film of 200 nm in thickness. In this embodiment, since the first n-type silicon semiconductor layer 103 is deposited to have a small thickness of 50 nm, the overetching of 40% can be carried out as the anisotropic etching on the polycrystalline silicon film without any disadvantage.

As shown at (c) in FIG. 7, after depositing an interlayer insulating film 117 of 400 nm in thickness on the whole surface of the silicon substrate 101 by a known method, the contact holes 113 of 0.25 μm in diameter are formed at the interlayer insulating film 117 for making contact with the source, the drain and the gate electrodes.

As shown at (d) in FIG. 7, $BF_2$ is ion-implanted through the contact hole 113 above the second p-type silicon semiconductor layer 104 to form a p-type diffusion layer 121 of a high impurity concentration ($4E20cm^{-3}$), and arsenic is ion-implanted through the contact hole 113 above the third n-type silicon semiconductor layer 107 to form an n-type diffusion layer 122 of a high impurity concentration ($4E20cm^{-3}$). Then, the multilayered interconnection 114 made of TiN/AlCu/TiN/Ti is formed. The reason for formation of the p-type and n-type diffusion layers 121 and 122 of a high impurity concentration is as follows. Since the second p-type silicon semiconductor layer 104 and the third n-type silicon semiconductor layer 107 are used commonly as the source/drain regions and the channel region, their impurity concentrations are insufficient for achieving ohmic contact. For this reason, the impurity concentrations of the second p-type silicon semiconductor layer 104 forming the source region and the third n-type silicon semiconductor layer 107 forming the drain region are increased.

The first and second embodiments have been described in connection with the method of manufacturing the CMOS-FET and CMOS inverter in which the high-vacuum method is used for the epitaxial growth of the semiconductor layers. Alternatively, methods which may allow the epitaxial grown at a lower temperature may be used, in which case the impurity concentration can be controlled more specifically. These alternative methods may be a bias sputtering method or an MBE method.

The first and second embodiments use the thermal oxide film as the gate oxide film. Alternatively, Other films such as an ONO (Oxide Nitride Oxide) film may be used for further improving the reliability, as can be done in an MOSFET of another structure. The gate electrode film and the multilayered metal interconnection, which are made of polycrystalline silicon and TiN/AlCu/TiN/Ti in the above embodiments, respectively, may obviously be made of other material.

A CMOSFET of a fourth embodiment and a method of manufacturing the same will be described below with reference to FIGS. 12 to 14. The fourth embodiment relates to a structure including a transistor of which channel length is about 0.2 µm.

After applying a resist film onto a semiconductor substrate made of silicon, exposure and development are effected on the resist film to form a resist pattern 11 having an opening at an n-channel transistor formation region on the semiconductor substrate 10 as shown at (a) in FIG. 12. Thereafter, using the resist pattern 11 as a mask, boron, phosphorus, boron, boron and phosphorus are successively ion-implanted into the semiconductor substrate 10 in accordance with an order shown in Table 1 to form a $p^-$-type well layer 12, a first $n^+$-type layer 13, a $p^-$-type layer 14 and a second $n^+$-type layer 15 which are layered in this order on the semiconductor substrate 10.

TABLE 1

| | Species | Acd. Vol. (keV) | Dose (ions/c.c.) |
|---|---|---|---|
| 1st | Boron | 300 | $5.0 \times 10^{13}$ |
| 2nd | Phosphorus | 500 | $6.5 \times 10^{13}$ |
| 3rd | Boron | 130 | $1.5 \times 10^{13}$ |
| 4th | Boron | 70 | $6.0 \times 10^{12}$ |
| 5th | Phosphorus | 80 | $1.0 \times 10^{14}$ |

After removing the resist pattern 11 by ashing, a resist film is applied onto the semiconductor substrate 10, and then exposure and development are effected on the resist film to form a resist pattern 16 having an opening at a p-channel transistor formation region on the semiconductor substrate 10, as shown at (b) in FIG. 12. Using the resist pattern 16 as a mask, phosphorus, boron, phosphorus, phosphorus and boron are successively ion-implanted into the semiconductor substrate 10 in accordance with the order shown in Table 2 to form an $n^-$-type well layer 17, a first $p^+$-type layer 18, an $n^-$-type layer 19 and a second $p^+$-type layer 20 which are layered in this order on the semiconductor substrate 10.

TABLE 2

| | Species | Acd. Vol. (keV) | Dose (ions/c.c.) |
|---|---|---|---|
| 1st | Phosphorus | 570 | $3.0 \times 10^{13}$ |
| 2nd | Boron | 250 | $4.0 \times 10^{13}$ |
| 3rd | Phosphorus | 350 | $1.3 \times 10^{13}$ |
| 4th | Phosphorus | 200 | $5.0 \times 10^{12}$ |
| 5th | Boron | 30 | $3.0 \times 10^{13}$ |

Then, after forming a silicon oxide film is formed on the surface of the semiconductor substrate 10 by normal pressure chemical vapor-phase growth method a resist film is applied onto the silicon oxide film, and then exposure and development are effected on the resist film to form a resist pattern 21 as shown at (c) in FIG. 12. Using the resist pattern 21 as a mask, dry etching mainly using a fluorine-contained gas is effected on the silicon oxide film, and then dry etching mainly using a chlorine-contained gas is effected on the semiconductor substrate 10 to form an $n^+$-type source (or drain) layer 15A, a $p^-$-type channel layer 14A, a $p^+$-type source (or drain) layer 20A and an $n^-$-type channel layer 19A. This etching is effected to reach a position immediately before the lowermost doped layer, so that luminescence of the impurity (i.e., phosphorus or boron) is detected to determine precisely a point at which the etching is to be terminated.

Similarly to the method already described, after forming a resist pattern 22 as shown at (d) in FIG. 12, etching is effected, using the resist pattern 22 as a mask, to form an $n^+$type drain (or source) layer 13A and a $p^+$-type drain (or source) layer 18A, whereby n-channel and p-channel transistors each formed of an insular multilayered portion are formed.

After removing the resist pattern 22 by ashing, the silicon oxide film is removed by etching with a fluoro-acid solution. Then, cleaning is carried out with liquid mixture of ammonium hydroxide and hydrogen peroxide to remove damage layers at the surfaces of the insular transistor layers of the n-channel and p-channel.

Figure 13A:
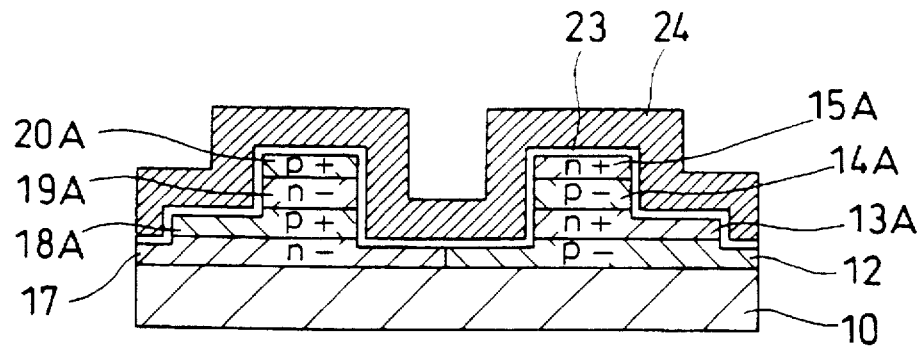
FIG. 13 shows, at (a)–(c), cross sections of the CMOSFET of the fourth embodiment at different steps in the manufacturing process.
Figure 13B:
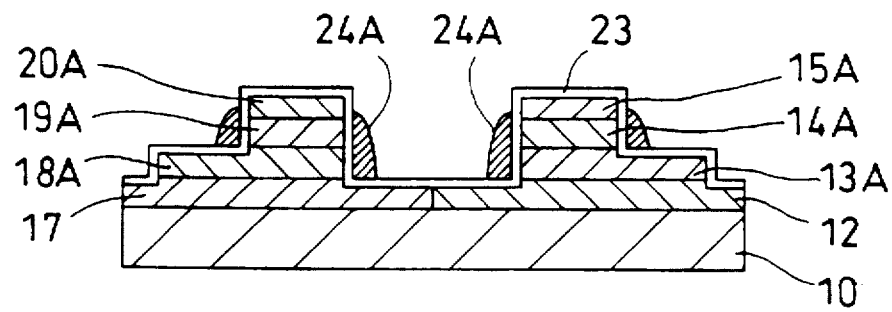
Figure 13C:
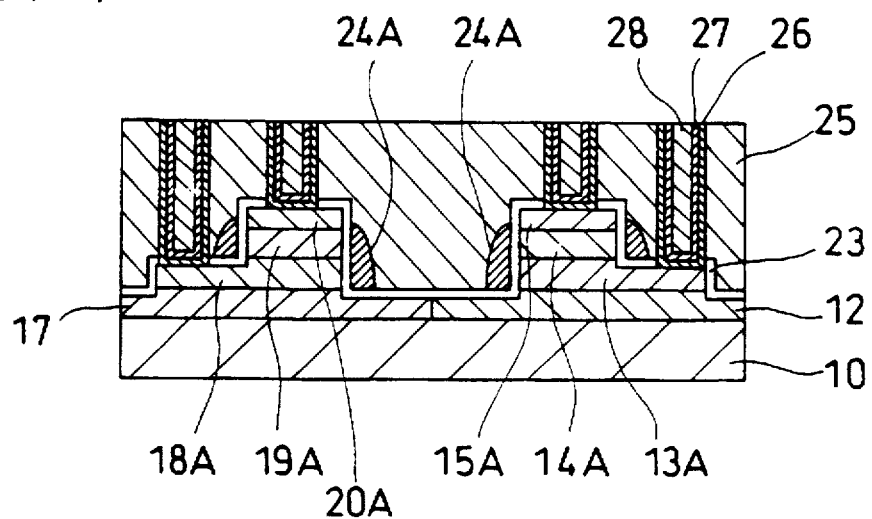

Then, heating is carried out at a temperature not higher than 800° C. to form a gate oxide film 23 by thermally oxidizing the surface portions of the n- and p-channel insular transistor layers as shown at (a) in FIG. 13. Then, the vacuum pressure vapor-phase growth method is carried out to deposit a polycrystalline silicon film 24 for forming the gate electrodes.

Similarly to the method already described, after forming a resist pattern on the polycrystalline silicon film 24, the polycrystalline silicon film 24 is etched with a chlorinecontained gas using the resist pattern as a mask, so that annular gate electrodes 24A are formed around the insular semiconductor layers as shown at (b) in FIG. 13.

After forming a resist pattern having an opening at the n-channel transistor formation region on the semiconductor substrate 10, arsenic is ion-implanted into the semiconductor substrate 10 with a dose of $4\times10^{15}$–$8\times10^{15}\text{cm}^{-2}$ using the resist pattern as a mask. Thereafter, the resist pattern is removed.

After forming a resist pattern having an opening at the p-channel transistor formation region on the semiconductor substrate 10, boron trifluoride ($BF_3$) is ion-implanted into the semiconductor substrate 10 with a dose of $3\times10^{15}$–$6\times10^{15}\text{cm}^{-2}$ using the resist pattern as a mask. Thereafter, the resist pattern is removed.

Rapid thermal annealing is carried out at a temperature of 900° C. for 60 seconds to activate the ion-implanted impurity so that the $n^+$-drain layer 13A, the $p^-$-type channel layer 14A, the $n^+$-type source layer 15A, the $p^+$-type drain layer 18A, the $n^-$-type channel layer 19A and the $p^+$-source layer 20A are activated.

After depositing a silicon oxide film (which will be referred to as a BPSG film) 25 containing borate glass ($B_2O_3$) and phosphate glass ($P_2O_5$) by the normal pressure chemical vapor-phase growth method, heat treatment is carried out at a temperature not higher than 750° C. Thereafter, the BPSG film 25 is polished by a chemical-mechanical polishing method (CMP) for smoothing it. After forming a resist pattern having an opening at a predetermined position on the BPSG film 25, dry etching is effected on the BPSG film 25 with a gas containing fluorine carbide using the resist pattern as a mask, so that an opening is formed at the BPSG film 25. After cleaning the opening, a titanium (Ti) film 26, a titanium nitride (TiN) film 27 and a tungsten (W) film 28 are successively formed in the opening, so that the opening is filled with these layers as shows at (c) in FIG. 13.

Figure 14A:
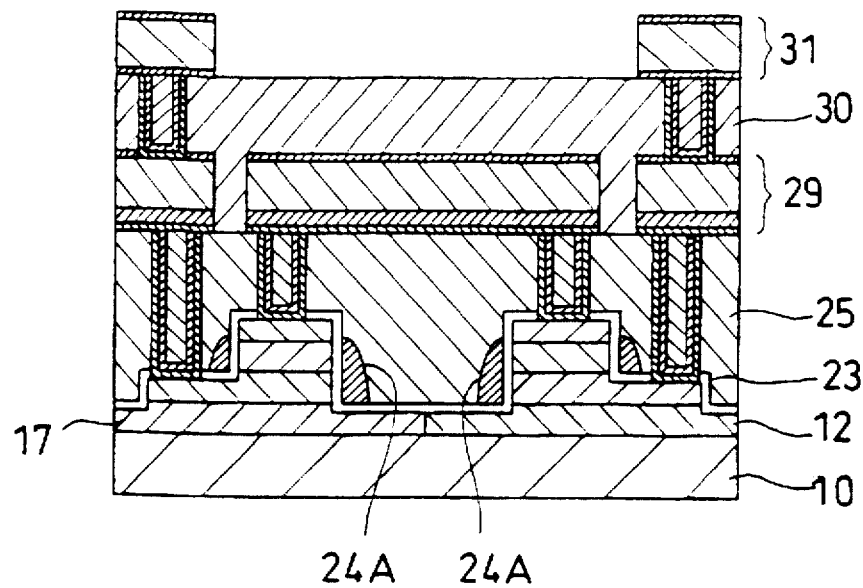
FIG. 14 shows, at (a) and (b), cross sections of the CMOSFET of the fourth embodiment at different steps in the manufacturing process.
Figure 14B:
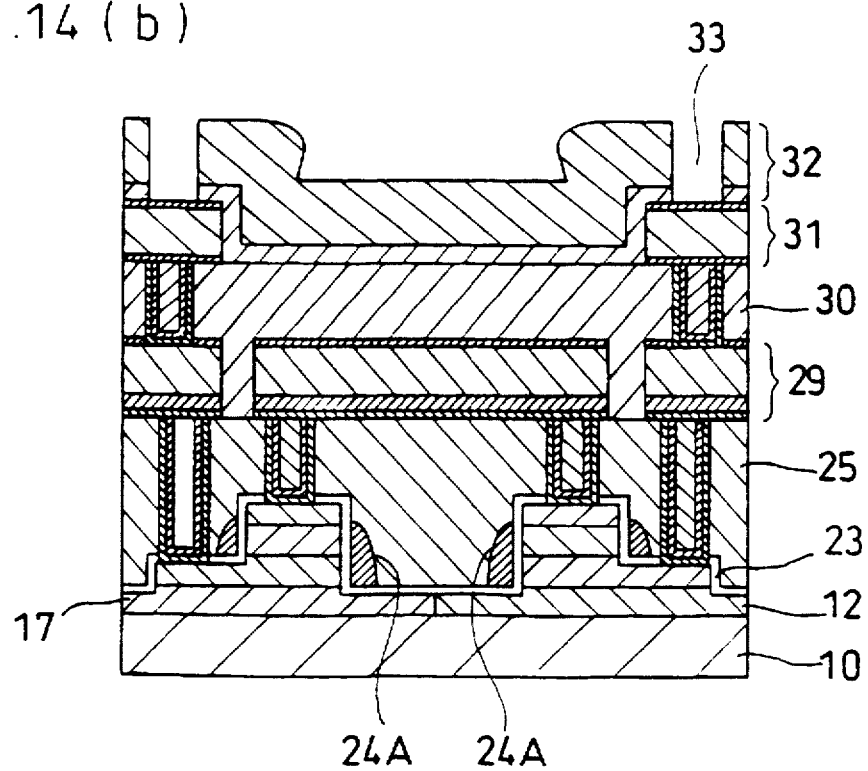

As shown at (a) in FIG. 14, after depositing a first metal interconnection 29 mainly containing aluminum and formed of a multilayered structure of TiN/AlCu/Ti, a silicon oxide film 30 is deposited on the first metal interconnection 29 by a plasma chemical vapor-phase growth method. After polishing and thereby smoothing the silicon oxide film 30 by CMP, through holes are formed at the silicon oxide film 30, and then second metal interconnections 31 mainly containing aluminum and formed of the multilayered structure of TiN/AlSiCu/Ti is formed.

As shown at (b) in FIG. 14, a phosphorus glass (PSG) film and a silicon nitride film (SiN) film are successively deposited to form a passivation film 32 by a plasma chemical vapor-phase growth method, and then openings 33 for leading the gate electrodes are formed at the passivation film 32.

Figure 15A:
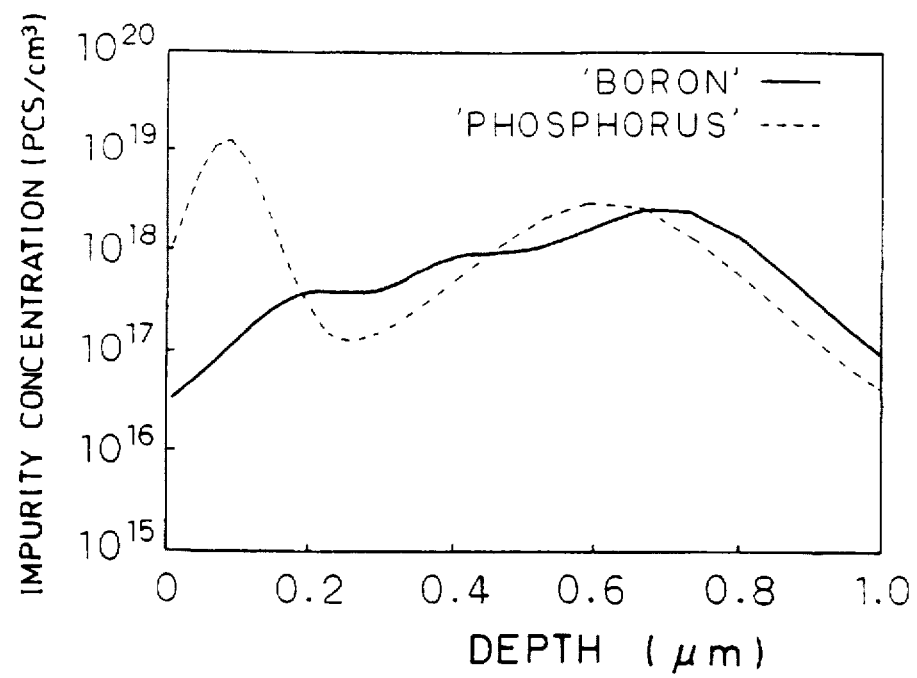
FIG. 15 shows, at (a) and (b), distribution of ion-implanted impurity in the CMOSFET and CMOS inverter of the fourth embodiment.
Figure 15B:
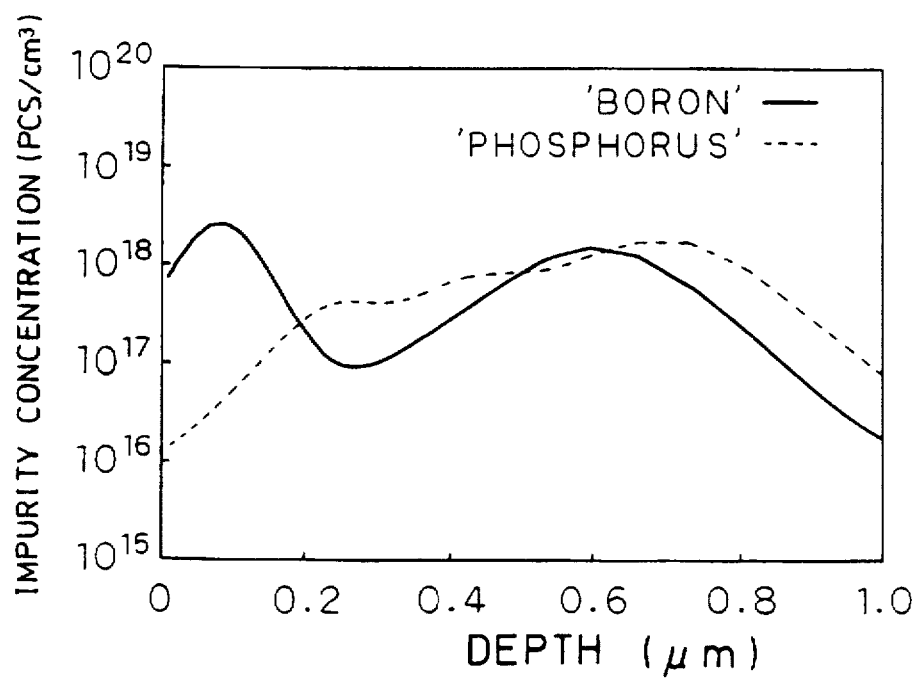

FIG. 15 shows, at (a) and (b), results of simulation of impurity profile or doping profile in the case where ion-implantation is carried out under the implantation conditions shown in the fourth embodiment. At (a) in FIG. 15 is shown the doping profile of the n-channel transistor, and at (b) in FIG. 15 is shown the doping profile of the p-channel transistor. Since the p$^-$-type layer 14 and the n$^-$-type layer 19 forming the channel layers are formed by implanting twice the boron and implanting twice the phosphorus under different implanting conditions, two peaks appear at the impurity distribution in each of the p$^-$-type and n$^-$-type layers 14A and 19A. Therefore, the impurity concentration in each of the p$^-$-type and n$^-$-type channel layers 14A and 19A can be uniform, so that each transistor can have stable characteristics.

Figure 16A:
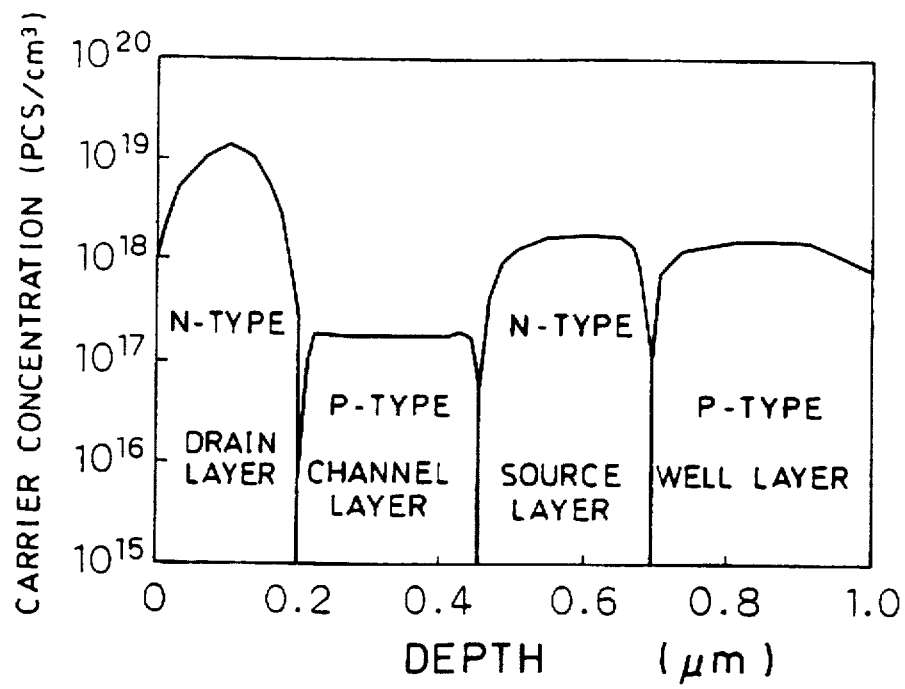
FIG. 16 shows, at (a) and (b), profiles of carrier concentration in the CMOSFET of the fourth embodiment.
Figure 16B:
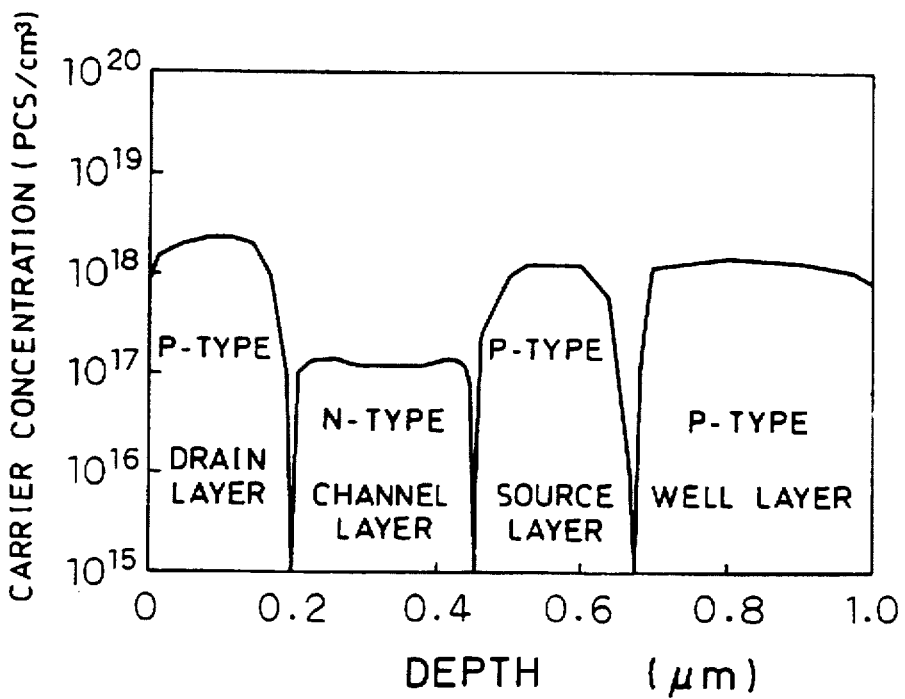
Figure 17A:
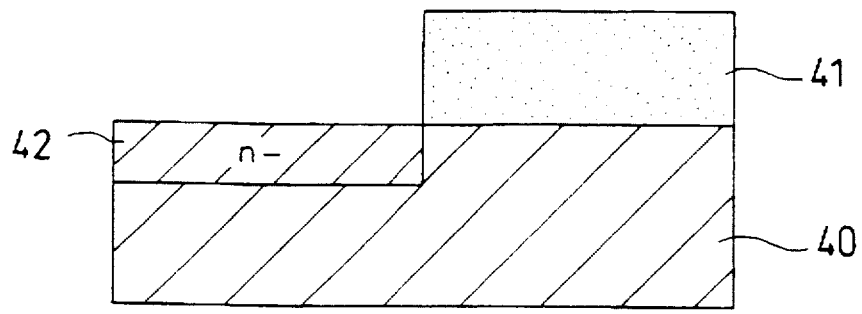
FIG. 17 shows, at (a)–(d), cross sections of a CMOSFET of a fifth embodiment of the invention at different steps in a manufacturing process.
Figure 17B:
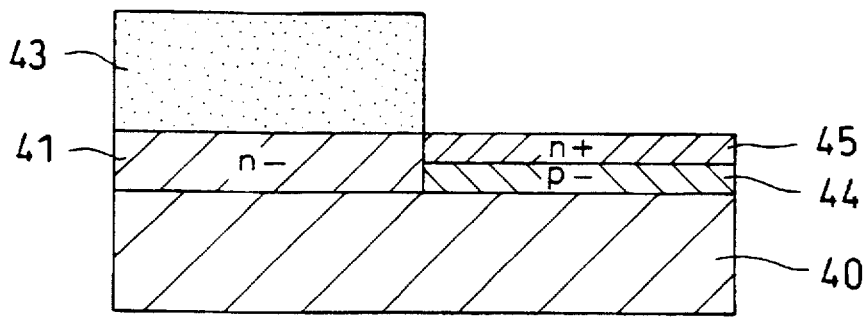
Figure 17C:
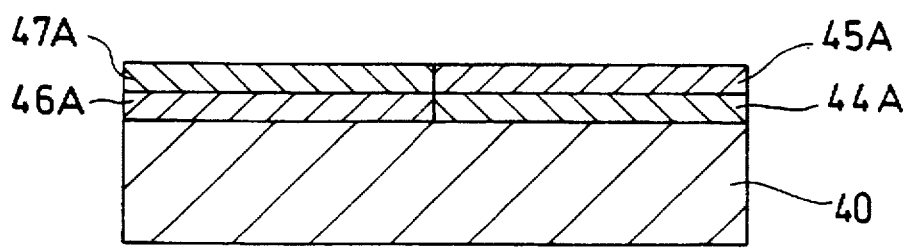
Figure 17D:
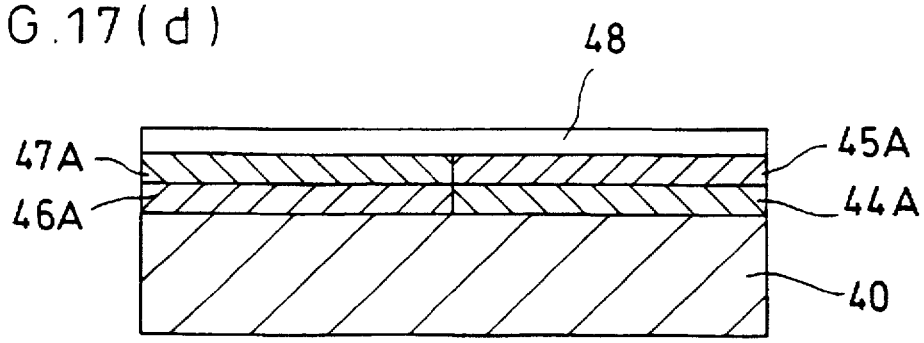

FIG. 16 shows, at (a) and (b), results obtained by simulating distribution of the carrier concentrations in the depth direction in the case where the implantation and heat treatment are carried out in accordance with the manner already described in connection with the fourth embodiment. As can be seen from (a) and (b) in FIG. 16, the impurity concentration in the depth direction are distributed substantially uniformly in each of the p$^-$-type and n$^-$-type channel layers 14A and 19A.

According to the fourth embodiment, the channel layers having a width of about 0.2μm are formed in the n-channel and p-channel transistors, and the impurity concentrations in the channel layers are set to a substantially constant value of $10^{17}$cm$^{-3}$, so that it can be confirmed that intended impurity concentration distribution is obtained.

By carrying out the ion-implantation and thereby forming the source layers, the channel layers and the drain layers as shown in the fourth embodiment, it is possible to form the vertical p-channel field-effect transistor and the vertical n-channel field effect transistor on the same semiconductor substrate, so that the CMOSFET can be formed easily and reliably.

Now, description will be given on a CMOSFET of a fifth embodiment and a method of manufacturing the same will be described below with reference to FIGS. 17–19. The fifth embodiment relates to a structure including a transistor of which channel length is about 0.1 μm.

After applying a resist film onto a semiconductor substrate 40 made of silicon, exposure and development are effected on the resist film to form a resist pattern 41 having an opening at a p-channel transistor formation region on the semiconductor substrate 40, as shown at (a) in FIG. 17. Thereafter, using the resist pattern 41 as a mask, phosphorus is ion-implanted into the semiconductor substrate 40 with a dose of 5×10$^{13}$cm$^{-2}$ to form an n$^-$-type layer 42. After removing the resist pattern 41 by ashing, heat treatment is carried out at a temperature of 1000° C. for 90 minutes.

Then, a resist film is applied onto the semiconductor substrate 40, and then exposure and development are effected on the resist film to form a resist pattern 43 having an opening at an n-channel transistor formation region on the semiconductor substrate 40, as shown at (b) in FIG. 17. Using the resist pattern 43 as a mask, boron is ion-implanted into the semiconductor substrate 40 with an acceleration voltage of 90 keV and a dose of 3×10$^{13}$cm$^{-2}$, and then arsenic is ion-implanted into the semiconductor substrate 40 with an acceleration voltage of 40 keV and a dose of 4×10$^{15}$cm$^{-2}$ to form p$^-$-type and n-type layers 44 and 45.

After forming a resist pattern having an opening at the p-channel transistor formation region on the semiconductor substrate 40, boron trifluoride (BF$_3$) is ion-implanted the semiconductor substrate 40 with an acceleration voltage of 30 keV and a dose of 3×10$^{15}$–6×10$^{15}$cm$^{-2}$ using the resist pattern as a mask. After removing the resist pattern, heat treatment is carried out at a temperature of 850° C. for 90 minutes to form an n-type well layer 46A, a p-type well layer 44A, an n$^+$-type drain (or source) layer 45A and a p$^+$-type drain (or source) layer 47A as shown at (c) in FIG. 17.

Then, a natural oxidation film is removed in a chamber of a chemical vapor-phase growth device capable of removing the natural oxidation film with HF vapor, and chemical vapor-phase growth method is continuously carried out to grow epitaxially a non-doped silicon film 48 by 50 nm as shown at (d) in FIG. 17. In this step, the growth temperature not higher than 800° C. is set in order to prevent change of the doping profiles.

Figure 18A:
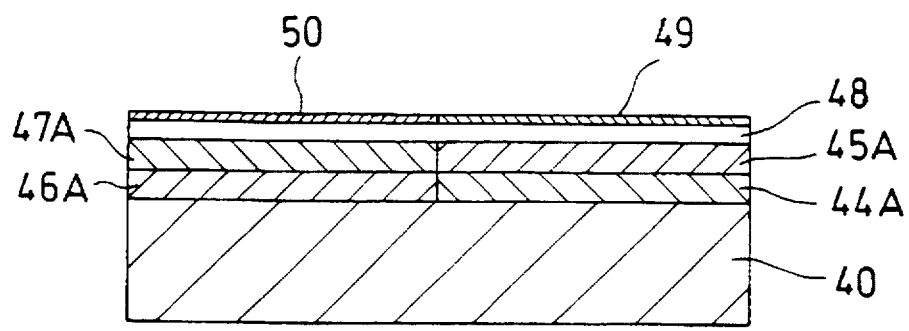
FIG. 18 shows, at (a)–(c), cross sections of the CMOSFET of the fifth embodiment at different steps in the manufacturing process.
Figure 18B:
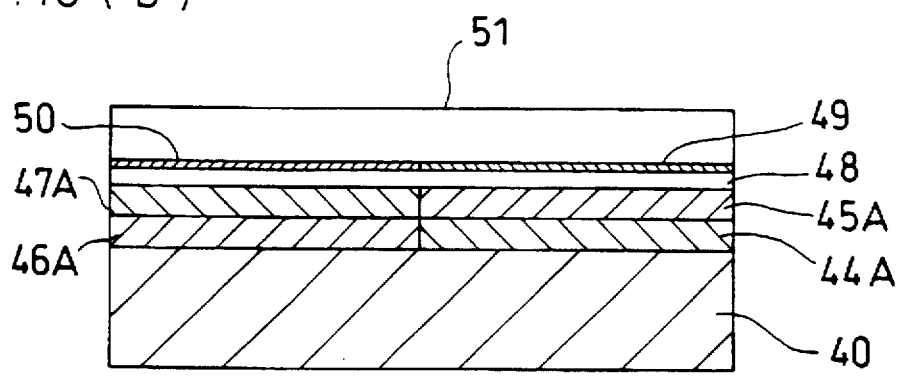
Figure 18C:
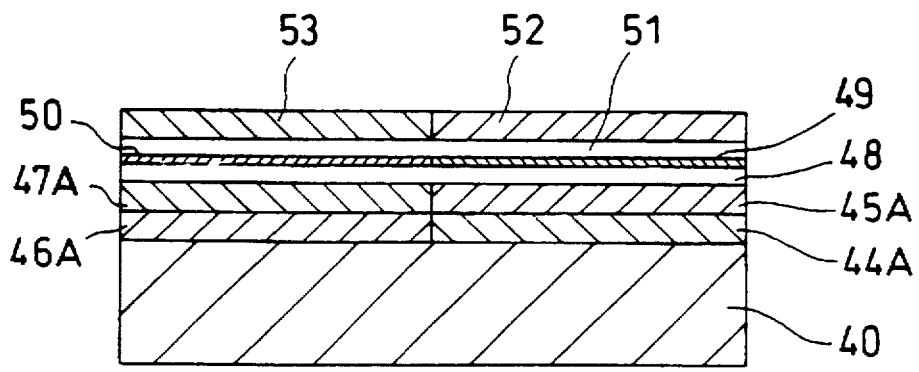
Figure 19:
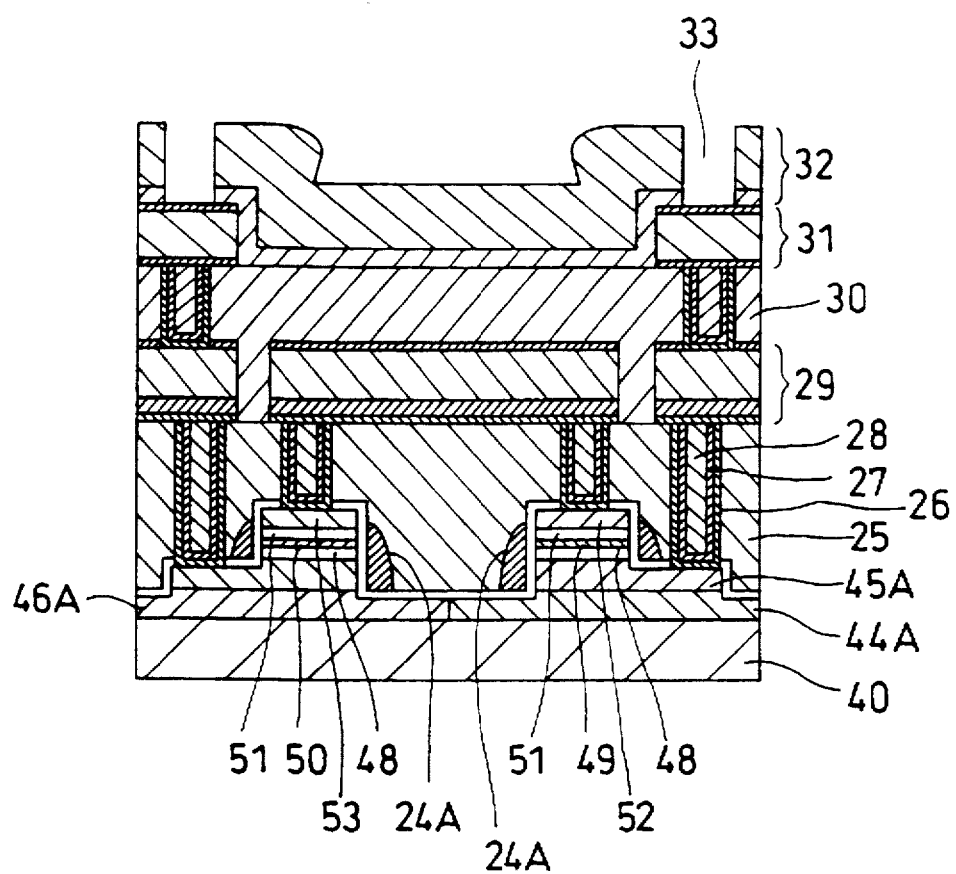
FIG. 19 is a cross section of the CMOSFET of the fifth embodiment at a step in the manufacturing process.

After forming a resist pattern having an opening at the n-channel transistor formation region on the semiconductor substrate 40, boron is ion-implanted into the semiconductor substrate 40 with an acceleration voltage of 5 keV and a dose of 1×10$^{13}$cm$^{-2}$ or more using the resist pattern as a mask, so that a p-type δ$^-$ doped layer 49 is formed as shown at (a) in FIG. 18. Then, the resist pattern is removed by ashing. After forming a resist pattern having an opening at the p-channel transistor formation region on the semiconductor substrate 40, arsenic is ion-implanted into the semiconductor substrate 40 with an acceleration voltage of 10 keV and a dose of 1×10$^{13}$ cm$^{-2}$ or more using the resist pattern as a mask, so that an n-type δ$^-$ doped layer 50 is formed. Then, the resist pattern is removed by ashing.

Then, a natural oxidation film is removed in a chamber of a chemical vapor-phase growth device capable of removing the natural oxidation film with HF vapor, and chemical vapor-phase growth method is carried out to grow epitaxially a non-doped silicon film 51 by 250 nm as shown at (b) in FIG. 18. Thereafter, similarly to the first embodiment, an n$^+$-type source (or drain) layer 52 and a p$^+$-type source (or drain) layer 53 are formed as shown at (c) in FIG. 18, and then, as shown in FIG. 19, processing is carried out to form a gate electrode 24A, a BPSG film 25, a titanium film 26, a titanium nitride film 27, a tungsten film 28, a first metal interconnection 29, a silicon oxide film 30, a second metal interconnection 31, a passivation film 32 and an opening 33 for leading the electrode.

If the channel length is reduced, the impurity concentration in the channel layer must be increased in order to prevent punch-through. However, increase of the impurity concentration results in increase of the field intensity and hence generation of hot carriers at a junction region of the channel layer with respect to the drain layer. In this fifth embodiment, therefore, the δ-doped layer is provided in the channel layer, whereby the punchthrough can be prevented without increasing the impurity concentration in the channel layer.

Since the method of the fifth embodiment employs ion implantation with a low energy, the δ-doped layer can be formed in either of the p-channel and n-channel transistors. As described above, it is possible to produce easily the vertical field-effect transistor having a small channel length.

By setting the acceleration energy of ions to an appropriate value, the thickness of the δ-doped layer can be controlled to a value not higher than 0.01 µm, so that the transistor having a channel length not longer than 0.1 µm can be manufactured easily.

By employing the structure in which the n-type δ-doped layer 50 of the p-channel transistor is thinner than the p-type δ-doped layer 49 of the n-channel transistor, the current drive capacity of the p-channel transistor is improved and the size thereof can be reduced, so that an area occupied by the circuit can be reduced.

A CMOSFET and a method of manufacturing the same of the sixth embodiment of the invention will be described below with reference to FIGS. 20 and 21.

Figure 20A:
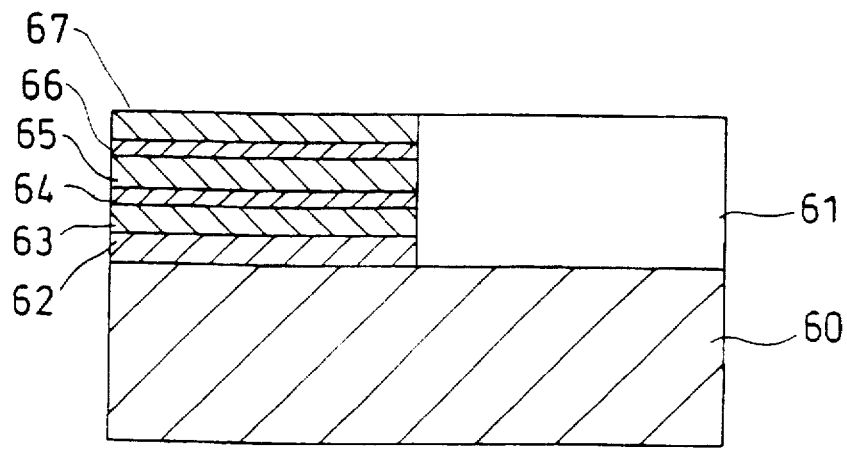
FIG. 20 shows, at (a)–(c), cross sections of a CMOSFET of a sixth embodiment of the invention at different steps in a manufacturing process.
Figure 20B:
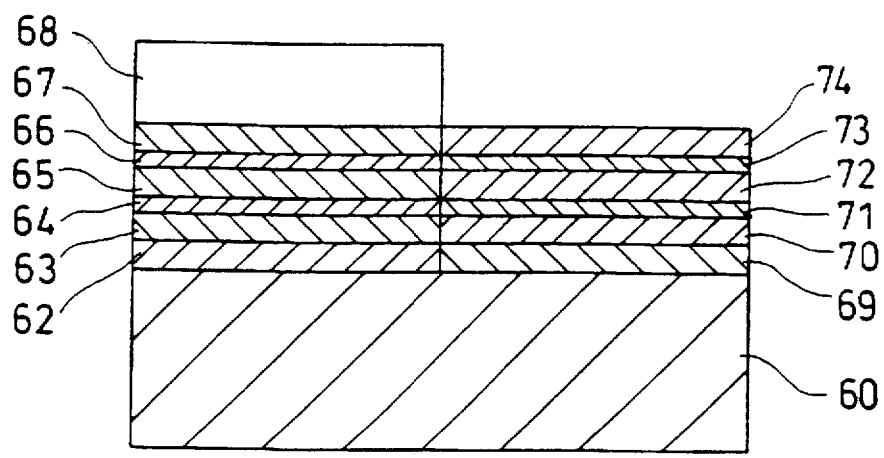
Figure 20C:
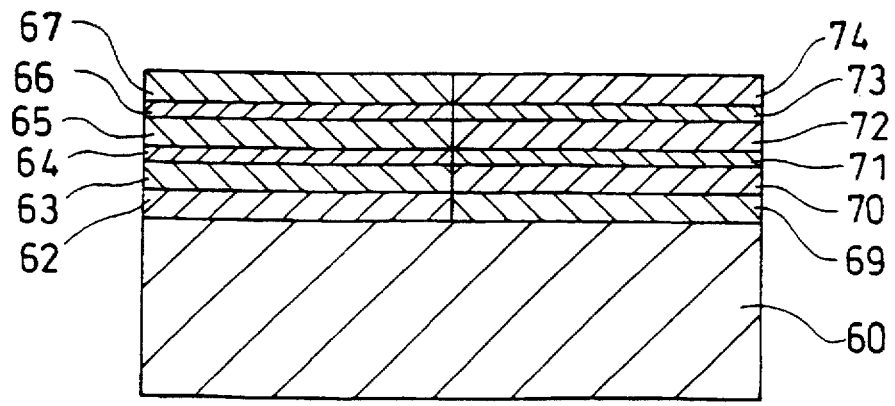

As shown at (a) in FIG. 20, after forming a silicon oxide film 61 on a semiconductor substrate 60 made of silicon, a resist pattern having an opening at a p-channel transistor formation region is formed on the silicon oxide film 61. Using the resist pattern as a mask, wet etching with a fluorine-contained solution or dry etching with a fluorine-contained gas is effected on the silicon oxide film 61 to form an opening reaching the semiconductor substrate 60 in the silicon oxide film 61. Thereafter, the resist pattern is removed by ashing. Thereafter, a natural oxidation film is removed in a chamber of a chemical vapor-phase growth device capable of removing the natural oxidation film with HF vapor, and selective vapor-phase growth method is carried out to grow successively an n-type well layer 62, a $p^+$-type drain (source) layer 63, a $p^-$-type first lightly doped layer 64, an n-type channel layer 65, a $p^-$-type second lightly doped layer 66 and a $p^+$-type source (or drain) layer 67. In this step, the growth temperature not higher than 800° C. is set in order to prevent change of the doping profiles. The thickness of the silicon oxide film 61 is set to be substantially equal to a sum of thicknesses of the respective layers grown by the selective vapor-phase growth method.

As shown at (b) in FIG. 20, normal pressure chemical vapor-phase growth method is carried out to form a silicon oxide film 68 entirely on the semiconductor substrate 60. After forming a resist pattern having an opening at an n-channel transistor formation region on the silicon oxide film 68, wet etching with a fluorine-contained solution or dry etching with a fluorinecontained gas is effected on the silicon oxide film 68, using the resist pattern as a mask, to form an opening reaching the semiconductor substrate 60 in the silicon oxide film 68. Thereafter, the resist pattern is removed by ashing. Thereafter, a natural oxidation film is removed in a chamber of a chemical vapor-phase growth device capable of removing the natural oxidation film with HF vapor, and selective vapor-phase growth method is carried out to grow successively a p-type well layer 69, an $n^+$-type drain (or source) layer 70, an $n^-$-type first lightly doped layer 71, a $p^-$-type channel layer 72, an $n^-$-type second lightly doped layer 73 and an $n^+$-type source (or drain) layer 74. Also in this step, the growth temperature not higher than 800° C. is set in order to prevent change of the doping profiles.

As shown at (c) in FIG. 20, the silicon oxide film 68 is completely removed by wet etching with a fluorine-contained solution.

Figure 21:
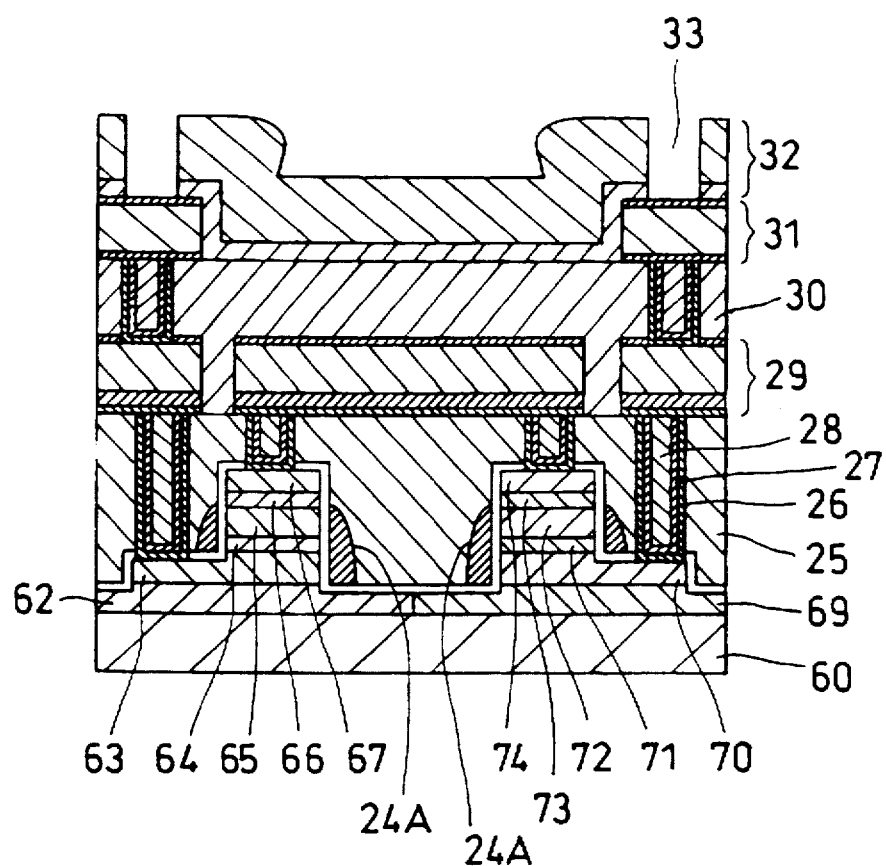
FIG. 21 is a cross section of the CMOSFET of the sixth embodiment at a step in the manufacturing process.

Then, similarly to the first embodiment, processing is carried out to form the gate electrode 24A, the BPSG film 25, the titanium film 26, the titanium nitride film 27, the tungsten film 28, the first metal interconnection 29, the silicon oxide film 30, the second metal interconnection 31, the passivation film 32 and the opening 33 for leading the electrode as shown in FIG. 21.

Figure 22:
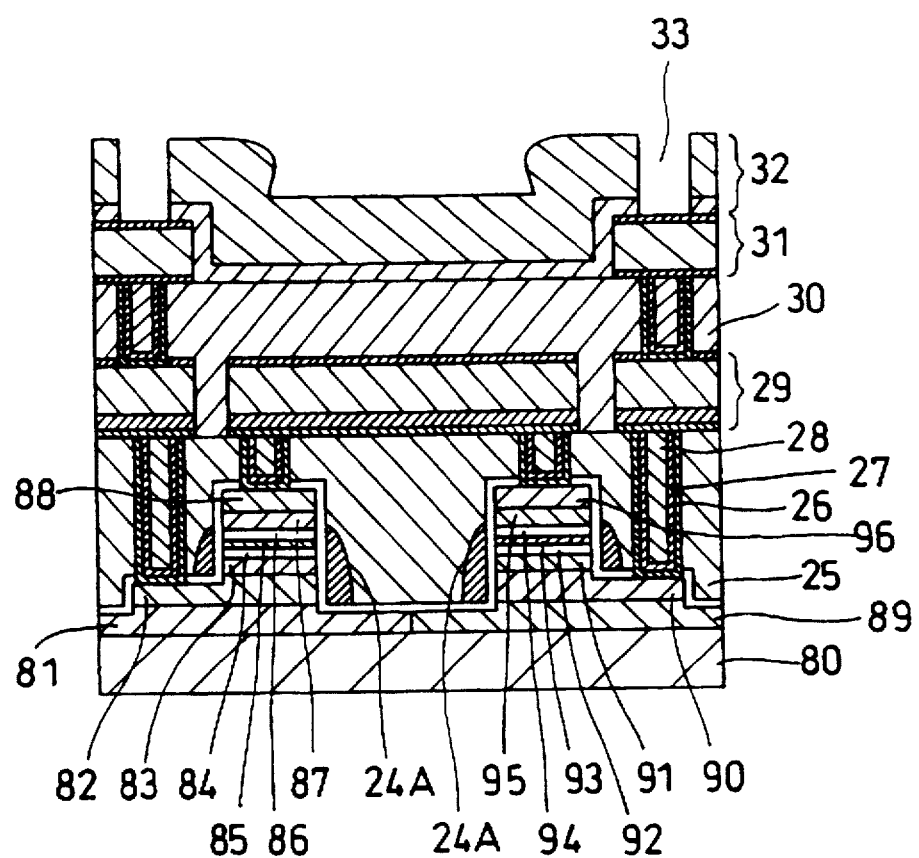
FIG. 22 is a cross section of the CMOSFET of the fourth embodiment of the invention.

FIG. 22 shows a sectional structure of a CMOSFET of a seventh embodiment of the invention. Although the sixth embodiment already described employs the channel layer formed of the $p^-$-type impurity layer and the channel layer formed of the $n^-$-type impurity layer, the seventh embodiment employs the structure similar to that of the fifth embodiment in which the δ-doped layer is arranged between the non-doped layers and thus can achieve the effect similarly to the fifth embodiment. As shown in FIG. 22, the CMOSFET of the seventh embodiment includes a semiconductor substrate 80 made of silicon, an n-type well layer 81, a $p^+$-type drain (or source) layer 82, a $p^-$-type first lightly doped layer 83, a non-doped silicon film 84, a p-type $\delta^-$ doped layer 85, a non-doped silicon film 86, a $p^-$-type second lightly doped layer 87, a $p^+$-type source (or drain) layer 88, a p-type well layer 89, an $n^+$-type drain (or source) layer 90, an $n^-$-type first lightly doped layer 91, a non-doped silicon film 92, a p-type $\delta^-$ doped layer 93, a non-doped silicon film 94, an $n^-$-type second lightly doped layer 95, an $n^+$-type source (or drain) layer 96, the gate electrode 24A, the BPSG film 25, the titanium film 26, the titanium nitride film 27, the tungsten film 28, the first metal interconnection 29, the silicon oxide film 30, the second metal interconnection 31, the passivation film 32 and the openings 33 for leading the electrode.

According to the seventh embodiment, complementary vertical field-effect transistors are obtained while precisely controlling the thickness of each layer, and a parasitic capacity, a parasitic resistance and others can be reduced, so that intended characteristics can be easily obtained. Also the layers of an impurity concentration lower than that of the source/drain layers can be easily formed at both sides of the channel layer. Owing to provision of the LDD (lightly Doped Drain) structure as described above, the intensity of the electric field at the vicinity of the drain layer can be reduced, and it is possible to produce the transistor which can suppress deterioration of characteristics due to hot carriers.

In the fifth embodiment, ion implantation and heat treatment are employed for forming the well layer, the source layer and the drain layer in the semiconductor substrate. Alternatively, other methods such as a selective vapor-phase epitaxial method may be IS employed for forming them. Plasma doping may be employed as a method for forming the δ-doped layer.

In the fifth embodiment, the non-doped silicon film is grown by the vapor-phase epitaxial method. Alternatively, other methods such as a low-temperature solid-phase epitaxial method may be employed for growing the same.

In the fifth and sixth embodiments, the natural oxide film is removed with HF vapor prior to the epitaxial growth. If the processing temperature is not higher than 800° C., the natural oxide film may be removed by other methods such as an argon plasma processing.

In each of the embodiments, the thermal oxide film is used as the gate insulating film. Alternatively, an ONO (Oxide-Nitride-Oxide) film or the like may be used, in which case the reliability is further improved, as can be done in an FET of other structures. Other material may obviously be employed instead of the polycrystalline silicon used for the film forming the gate electrode as well as TiN/AlSiCu/Ti used for the multilayered metal interconnection. The smoothing of the interlayer insulating film may be carried out by another method such as a resist etchback method or a method applying an SOG (Spin On Glass).

What is claimed is:

1. A semiconductor device comprising:

a semiconductor substrate;

a first insular multilayered portion formed on said semiconductor substrate and including, in a successively layered fashion, a first semiconductor layer doped with impurity of a first conductivity type and forming a source or a drain, a second semiconductor layer doped with impurity of a second conductivity type and forming a channel, and a third semiconductor layer doped with impurity of the first conductivity type and forming the drain or the source;

a second insular multilayered portion formed on said semiconductor substrate and including, in a successively layered fashion, a fourth semiconductor layer doped with impurity of the second conductivity type and forming a source or a drain, a fifth semiconductor layer doped with impurity of the first conductivity type and forming a channel, and a sixth semiconductor layer doped with impurity of the second conductivity type and forming the drain or the source;

a first gate electrode formed on a side surface of said second semiconductor layer with a first gate insulating film therebetween; and a second gate electrode formed on a side surface of said fifth semiconductor layer with a second gate insulating film therebetween, wherein said first semiconductor layer has a first projection projected beyond said second semiconductor layer in a surface direction of said substrate;

said fourth semiconductor layer has a second projection projected beyond said fifth semiconductor layer in the surface direction of said substrate;

the thickness of said first projection is smaller than the thickness of said third semiconductor layer; and the thickness of said second projection is smaller than the thickness of said sixth semiconductor layer.

* * * * *